(12) United States Patent
Futase et al.

(10) Patent No.: US 7,923,319 B2
(45) Date of Patent: Apr. 12, 2011

(54) METHOD FOR MANUFACTURING A SEMICONDUCTOR INTEGRATED CIRCUIT DEVICE CIRCUIT DEVICE

(75) Inventors: Takuya Futase, Tokyo (JP); Shuhei Murata, Tokyo (JP); Takeshi Hayashi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/622,524

(22) Filed: Nov. 20, 2009

(65) Prior Publication Data

US 2010/0129974 A1  May 27, 2010

(30) Foreign Application Priority Data

Nov. 26, 2008  (JP) ................... 2008-300439

(51) Int. Cl.
*H01L 21/336* (2006.01)
(52) U.S. Cl. ........ 438/197; 438/597; 438/778; 438/795; 257/E21.409
(58) Field of Classification Search .................. 438/197, 438/303, 597, 664, 682, 778, 795
See application file for complete search history.

(56) References Cited

U.S. PATENT DOCUMENTS

| | | | |
|---|---|---|---|
| 6,831,008 B2 | 12/2004 | Lu et al. | |
| 7,122,477 B2 | 10/2006 | Ikeda | |
| 7,407,888 B2 | 8/2008 | Ito et al. | |
| 2007/0161218 A1 | 7/2007 | Ichinose et al. | |
| 2007/0257372 A1 | 11/2007 | Tada et al. | |
| 2008/0124922 A1 | 5/2008 | Kawamura et al. | |

FOREIGN PATENT DOCUMENTS

| | | |
|---|---|---|
| JP | 10-112446 A | 4/1998 |
| JP | 2000-031092 A | 1/2000 |
| JP | 2001-284284 A | 10/2001 |
| JP | 2003-086569 A | 3/2003 |
| JP | 2004-128501 A | 4/2004 |
| JP | 2007-019330 A | 1/2007 |
| JP | 2007-027680 A | 2/2007 |
| JP | 2007-214538 A | 8/2007 |
| JP | 2008-135635 A | 6/2008 |
| JP | 2009-088421 A | 4/2009 |
| WO | WO-2005/098913 A1 | 10/2005 |
| WO | WO-2007/020684 A1 | 2/2007 |

*Primary Examiner* — Savitri Mulpuri
(74) *Attorney, Agent, or Firm* — Miles & Stockbridge P.C.

(57) ABSTRACT

When a natural oxide film is left at the interface between a metal silicide layer and a silicon nitride film, in various heating steps (steps involving heating of a semiconductor substrate, such as various insulation film and conductive film deposition steps) after deposition of the silicon nitride film, the metal silicide layer partially abnormally grows due to oxygen of the natural oxide film occurring on the metal silicide layer surface. A substantially non-bias (including low bias) plasma treatment is performed in a gas atmosphere containing an inert gas as a main component on the top surface of a metal silicide film of nickel silicide or the like over source/drain of a field-effect transistor forming an integrated circuit. Then, a silicon nitride film serving as an etching stop film of a contact process is deposited. As a result, without causing undesirable cutting of the metal silicide film, the natural oxide film over the top surface of the metal silicide film can be removed.

17 Claims, 16 Drawing Sheets

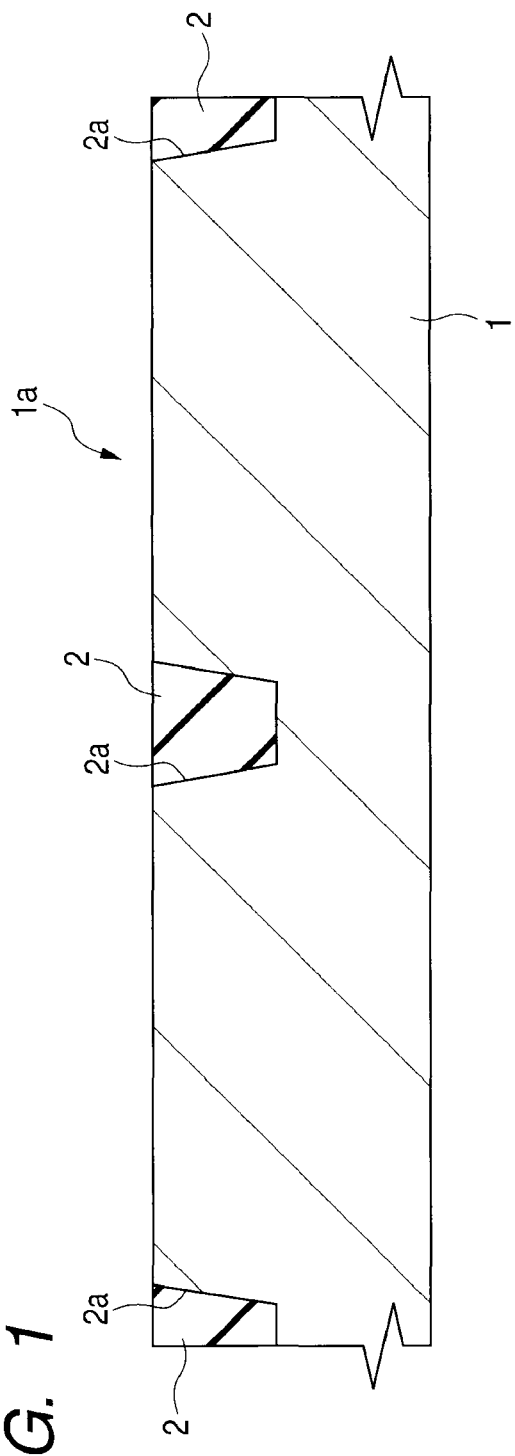
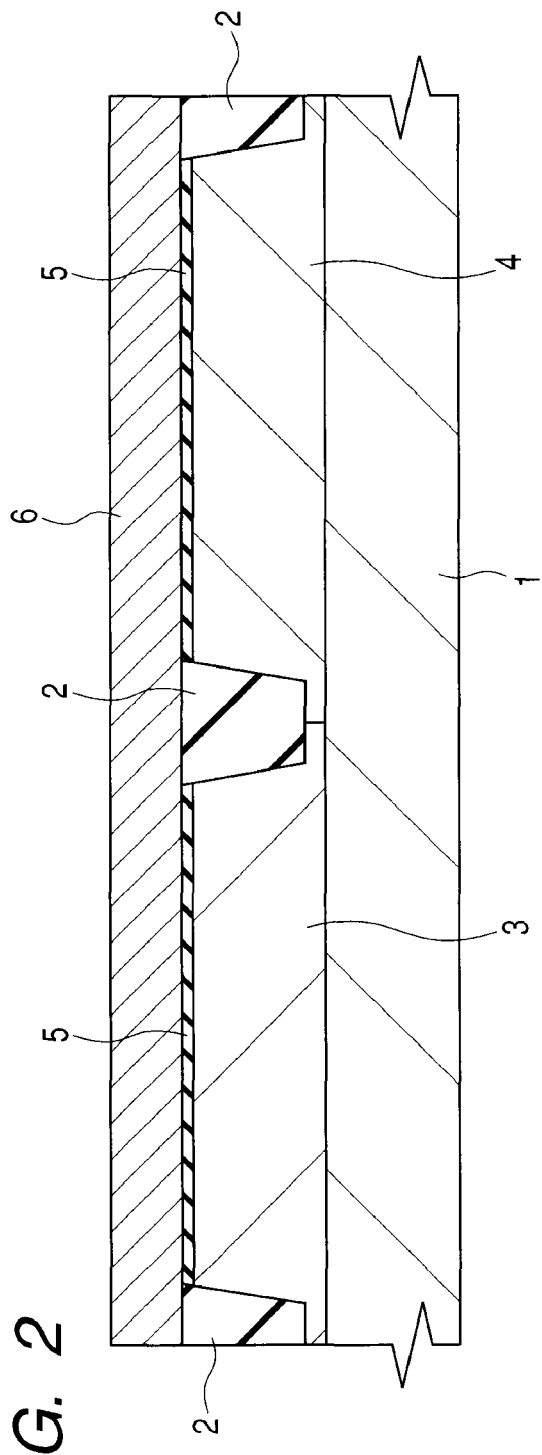

METHOD FOR MANUFACTURING A SEMICONDUCTOR INTEGRATED CIRCUIT DEVICE CIRCUIT DEVICE

CROSS-REFERENCE TO RELATED APPLICATIONS

The disclosure of Japanese Patent Application No. 2008-300439 filed on Nov. 26, 2008 including the specification, drawings and abstract is incorporated herein by reference in its entirety.

BACKGROUND OF THE INVENTION

The present invention relates to a technology effectively applicable to a metal silicide-related technology in a method for manufacturing a semiconductor integrated circuit device (or a semiconductor device).

Japanese Unexamined Patent Publication No. 2003-86569 (Patent Document 1) or U.S. Pat. No. 7,122,477 (Patent Document 2) discloses a technology regarding a plasma treatment method for removing a natural oxide film on a $CoSi_2$ film surface.

Japanese Unexamined Patent Publication No. Hei 10 (1998)-112446 (Patent Document 3) discloses a technology in which a TiN layer is formed after removal of a $TiO_x$ layer over a Ti silicide layer.

Japanese Unexamined Patent Publication No. 2001-284284 (Patent Document 4) discloses a technology in which a TiN layer is grown after removal of a natural oxide film on a $CoSi_2$ layer surface.

International Publication No. WO 2007/020684 (Patent Document 5) discloses a technology in which a silicon nitride film for preventing diffusion of Cu is formed on Cu wiring formed using a damascene method.

Japanese Unexamined Patent Publication No. 2007-19330 (Patent Document 6) discloses a technology in which a silicon nitride film is formed after performing a plasma treatment in a gas atmosphere containing ammonia on a nickel silicide surface.

Japanese Unexamined Patent Publication No. 2004-128501 (Patent Document 7) or U.S. Pat. No. 6,831,008 (Patent Document 8) also discloses a technology in which a silicon nitride film is similarly formed after performing a plasma treatment in a gas atmosphere containing ammonia on a nickel silicide surface.

Japanese Unexamined Patent Publication No. 2008-135635 (Patent Document 9) or US Patent No. 2008-0124922 (Patent Document 10) also discloses a technology in which a silicon nitride film is similarly formed after performing a plasma treatment in a gas atmosphere containing ammonia on a nickel silicide surface.

Japanese Unexamined Patent Publication No. 2000-31092 (Patent Document 11) also discloses a technology in which an interlayer insulation film is formed after performing a hydrogen plasma reduction treatment on a cobalt silicide or nickel silicide surface.

International Publication No. WO 2006/100765 (Patent Document 12) or US Patent No. 2007-0257372 (Patent Document 13) discloses a technology in which a barrier metal is formed after performing a plasma treatment in a gas atmosphere containing a nitrogen gas and a hydrogen gas on the nickel silicide surface of a contact hole bottom.

Japanese Unexamined Patent Publication No. 2007-27680 (Patent Document 14) or U.S. Pat. No. 7,407,888 (Patent Document 15) discloses a technology in which a barrier metal is formed after performing a plasma treatment in a hydrogen gas atmosphere on the nickel silicide surface of a contact hole bottom.

Japanese Unexamined Patent Publication No. 2007-214538 (Patent Document 16) or US Patent No. 2007-0161218 (Patent Document 17) discloses a technology in which a barrier metal is formed after performing a plasma treatment in a gas atmosphere containing an ammonia gas and a hydrogen gas on the nickel silicide surface of a contact hole bottom.

[Patent Document 1]
  Japanese Unexamined Patent Publication No. 2003-86569
[Patent Document 2]
  U.S. Pat. No. 7,122,477
[Patent Document 3]
  Japanese Unexamined Patent Publication No. Hei 10 (1998)-112446
[Patent Document 4]
  Japanese Unexamined Patent Publication No. 2001-284284
[Patent Document 5]
  International Publication No. WO 2007/020684
[Patent Document 6]
  Japanese Unexamined Patent Publication No. 2007-19330
[Patent Document 7]
  Japanese Unexamined Patent Publication No. 2004-128501
[Patent Document 8]
  U.S. Pat. No. 6,831,008
[Patent Document 9]
  Japanese Unexamined Patent Publication No. 2008-135635
[Patent Document 10]
  US Patent No. 2008-0124922
[Patent Document 11]
  Japanese Unexamined Patent Publication No. 2000-31092
[Patent Document 12]
  International Publication No. WO 2005/098913
[Patent Document 13]
  US Patent No. 2007-0257372
[Patent Document 14]
  Japanese Unexamined Patent Publication No. 2007-27680
[Patent Document 15]
  U.S. Pat. No. 7,407,888
[Patent Document 16]
  Japanese Unexamined Patent Publication No. 2007-214538
[Patent Document 17]
  US Patent No. 2007-0161218

SUMMARY OF THE INVENTION

With an increase in scale of integration of a semiconductor integrated circuit device, a field-effect transistor (MISFET: Metal Insulator Semiconductor Field Effect Transistor) is miniaturized according to the scaling rule. However, the resistance of a gate or a source/a drain increases. Thus, even miniaturization of the field-effect transistor unfavorably cannot provide high-speed operation. Under such circumstances, a study has been conducted on the following salicide technology: a low resistance metal silicide layer such as a nickel silicide layer or a cobalt silicide layer is formed by self-alignment on the surfaces of the conductive film forming gates and semiconductor regions forming sources/drains, thereby to reduce the resistance of the gates, or the sources/drains.

In regard to this, a study by the present inventors revealed the following. On the surfaces of the conductive film forming gates and a semiconductor regions forming sources/drains, a metal silicide layer is formed by a salicide process. Then, over the semiconductor substrate including the surface of the metal silicide layer, a silicon nitride film is formed. Subsequently, over the silicon nitride film, a thick silicon oxide interlayer insulation film is formed. In the interlayer insulation film, contact holes are opened. For opening the contact holes, first, the silicon nitride film is allowed to function as an etching stopper, and the interlayer insulation film is dry etched. Then, at the bottoms of the contact holes, the silicon nitride film is dry etched. After the formation of the contact holes, a plug is embedded in each contact hole.

However, when the silicon nitride film is formed with a natural oxide film formed on the surface of the metal silicide layer, it results that the natural oxide film is left at the interface between the metal silicide layer and the silicon nitride film. When the natural oxide film is left at the interface between the metal silicide layer and the silicon nitride film, the following occurs. In various heating steps (steps involving heating of a semiconductor substrate, such as various insulation film and conductive film deposition steps) after deposition of the silicon nitride film, the metal silicide layer partially abnormally grows due to oxygen in the natural oxide film occurring on the metal silicide layer surface. The abnormal growth of such a metal silicide layer induces an increase in resistance of the metal silicide layer. Further, when the metal silicide layer has abnormally grown at the channel part, an increase in leakage current between the source/drain of the field-effect transistor may be caused. This remarkably reduces the performances of the semiconductor integrated circuit device.

Further, when the natural oxide film on the surface of the metal silicide layer is removed by a general plasma treatment, namely, a bias plasma treatment, the sputtering action is too strong. Accordingly, the metal silicide layer is cut, unfavorably causing an increase in junction leakage, or other problems.

Further, when the natural oxide film on the surface of the metal silicide layer is removed by a plasma treatment of a reducing gas containing hydrogen, deterioration of the transistor characteristics due to hydrogen may be observed.

The present invention has been made in order to solve these problems.

It is an object of the present invention to provide a technology capable of improving the performances of the semiconductor integrated circuit device.

The foregoing and other objects and novel features of the present invention will be apparent from the description of this specification and the accompanying drawings.

Summaries of the representative ones of the inventions disclosed in the present application will be described in brief as follows.

Namely, in accordance with the present application, a substantially non-bias (including low bias) plasma treatment is performed in a gas atmosphere containing an inert gas as one of main components on the top surface of a metal silicide film of nickel silicide or the like over source/drain of a field-effect transistor forming an integrated circuit. Then, a silicon nitride film serving as an etching stop film of a contact process is deposited.

Effects obtainable by the representative ones of the inventions disclosed in the present application will be described in brief as follows.

Namely, in the present application, a substantially non-bias (including low bias) plasma treatment is performed in a gas atmosphere containing an inert gas as one of main components on the top surface of a metal silicide film of nickel silicide or the like over source/drain of a field-effect transistor forming an integrated circuit. Then, a silicon nitride film serving as an etching stop film of a contact process is deposited. As a result, without causing undesirable cutting of the metal silicide film, the natural oxide film over the top surface of the metal silicide film can be removed.

BRIEF DESCRIPTION OF THE DRAWINGS

FIG. 1 is a cross sectional view of an essential part during a manufacturing step of a semiconductor integrated circuit device which is one embodiment of the present invention;

FIG. 2 is a cross sectional view of an essential part during a manufacturing step of the semiconductor integrated circuit device following FIG. 1;

DESCRIPTION OF THE PREFERRED EMBODIMENTS

Summary of Embodiments

Figure 3:
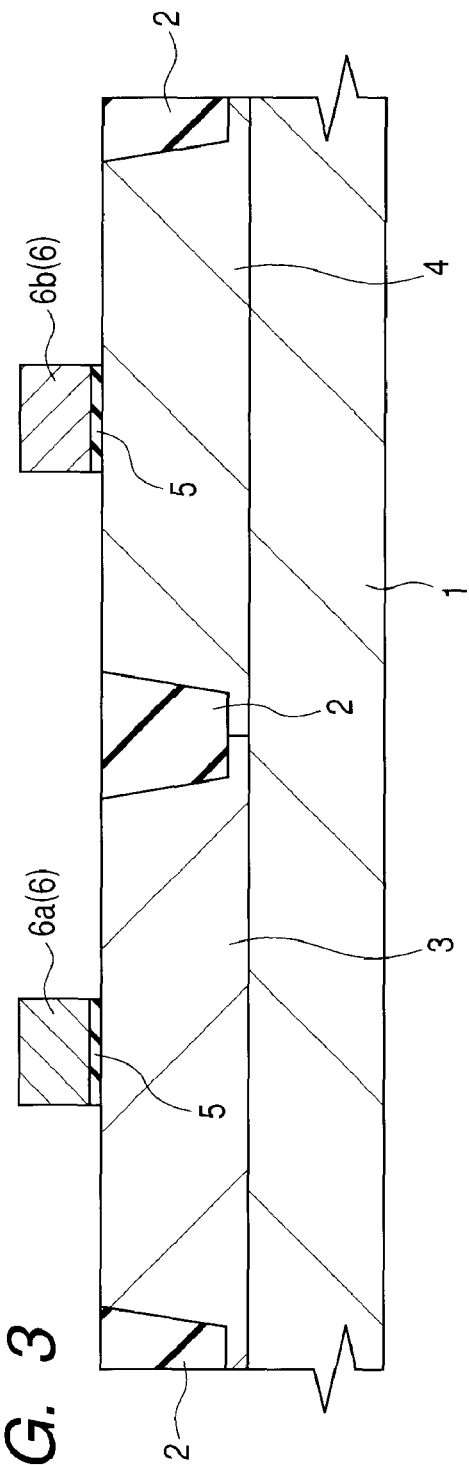
FIG. 3 is a cross sectional view of an essential part during a manufacturing step of the semiconductor integrated circuit device following FIG. 2.

First, summaries will be described on representative embodiments of the invention disclosed in the present application.

1. A method for manufacturing a semiconductor integrated circuit device, which includes the steps of: (a) forming a MISFET in a region in the vicinity of a first main surface of a semiconductor wafer, the MISFET having (x1) source/drain regions disposed in a surface region of the first main surface, (x2) a gate insulation film disposed over the first main surface, (x3) a gate electrode including silicon as a main component and disposed over the gate insulation film, and (x4) a silicide film disposed over the source/drain regions; (b) after the step (a), setting the semiconductor wafer over a first lower electrode in a first gas phase treatment chamber with the first main surface facing upward; (c) after the step (b), while the semiconductor wafer being set over the first lower electrode grounded with the first main surface facing upward, carrying out a plasma treatment on the first main surface under a first gas atmosphere containing an inert gas as one of main components; and (d) after the step (c), while the semiconductor wafer being set over the first lower electrode with the first main surface facing upward, forming a silicon nitride film over the first main surface by a CVD treatment.

2. The method for manufacturing a semiconductor integrated circuit device according to the item 1, wherein the inert gas is an argon gas.

3. The method for manufacturing a semiconductor integrated circuit device according to the item 1 or 2, wherein the first gas atmosphere substantially does not contain hydrogen.

4. The method for manufacturing a semiconductor integrated circuit device according to any one of the items 1 to 3, wherein the first gas atmosphere substantially does not contain a hydrogen gas and an ammonia gas.

5. The method for manufacturing a semiconductor integrated circuit device according to any one of the items 1 to 4, wherein the first gas atmosphere contains a nitrogen gas as one of main components.

6. The method for manufacturing a semiconductor integrated circuit device according to any one of the items 1 to 5, which further includes the steps of: (e) forming a silicon oxide film type premetal interlayer insulation film over the silicon nitride film; (f) opening a contact hole in the premetal interlayer insulation film with the silicon nitride film as an etching stop film; (g) after the step (f), etching the silicon nitride film, thereby to extend the contact hole to the top surface of the silicide film disposed over the source/drain regions; (h) after the step (g), setting the semiconductor wafer over a second lower electrode in a second gas phase treatment chamber with the first main surface facing upward; (i) after the step (h), while the semiconductor wafer being set over the second lower electrode grounded with the first main surface facing upward, carrying out a plasma treatment on the first main surface under a second gas atmosphere containing an inert gas as one of main components; (j) after the step (i), while the semiconductor wafer being set over the second lower electrode grounded with the first main surface facing upward, forming a barrier metal film over the inner surface of the contact hole; and (k) after the step (j), filling the contact hole with a metal containing tungsten as a main component.

7. The method for manufacturing a semiconductor integrated circuit device according to any one of the items 1 to 5, which further includes the steps of: (e) forming a silicon oxide film type premetal interlayer insulation film over the silicon nitride film; (f) opening a contact hole in the premetal interlayer insulation film with the silicon nitride film as an etching stop film; (g) after the step (f), etching the silicon nitride film, thereby to extend the contact hole to the top surface of the silicide film disposed over the source/drain regions; (j) after the step (g), forming a barrier metal film over the inner surface of the contact hole; and (k) after the step (j), filling the contact hole with a metal containing tungsten as a main component.

8. The method for manufacturing a semiconductor integrated circuit device according to the item 6, wherein the inert gas is an argon gas.

9. The method for manufacturing a semiconductor integrated circuit device according to the item 6 or 8, wherein the second gas atmosphere substantially does not contain hydrogen.

10. The method for manufacturing a semiconductor integrated circuit device according to the item 6, 8, or 9, wherein the second gas atmosphere substantially does not contain a hydrogen gas and an ammonia gas.

11. The method for manufacturing a semiconductor integrated circuit device according to the item 6, 8, 9 or 10, wherein the second gas atmosphere substantially does not contain a nitrogen gas.

12. A method for manufacturing a semiconductor integrated circuit device, which includes the steps of: (a) forming a MISFET in a region in the vicinity of a first main surface of a semiconductor wafer, the MISFET having (x1) source/drain regions disposed in a surface region of the first main surface, (x2) a gate insulation film disposed over the first main surface, (x3) a gate electrode including silicon as a main component and disposed over the gate insulation film, and (x4) a silicide film disposed over the source/drain regions; (b) after the step (a), disposing the semiconductor wafer over a first lower electrode in a first gas phase treatment chamber with the first main surface facing upward; (c) after the step (b), while the semiconductor wafer being set over the first lower electrode with the first main surface facing upward, carrying out a low bias plasma treatment with a self bias of the first lower electrode of 10 V or less on the first main surface under a first gas atmosphere containing an inert gas as one of main components; and (d) after the step (c), while the semiconductor wafer being set over the first lower electrode with the first main surface facing upward, forming a silicon nitride film over the first main surface by a CVD treatment.

13. The method for manufacturing a semiconductor integrated circuit device according to the item 12, wherein the inert gas is an argon gas.

14. The method for manufacturing a semiconductor integrated circuit device according to the item 12 or 13, wherein the first gas atmosphere substantially does not contain hydrogen.

15. The method for manufacturing a semiconductor integrated circuit device according to any one of the items 12 to 14, wherein the first gas atmosphere substantially does not contain a hydrogen gas and an ammonia gas.

16. The method for manufacturing a semiconductor integrated circuit device according to any one of the items 12 to 15, wherein the first gas atmosphere contains a nitrogen gas as one of main components.

17. The method for manufacturing a semiconductor integrated circuit device according to any one of the items 12 to 16, which further includes the steps of: (e) forming a silicon oxide film type premetal interlayer insulation film over the silicon nitride film; (f) opening a contact hole in the premetal interlayer insulation film with the silicon nitride film as an etching stop film; (g) after the step (f), etching the silicon nitride film, thereby to extend the contact hole to the top surface of the silicide film disposed over the source/drain regions; (h) after the step (g), setting the semiconductor wafer over a second lower electrode in a second gas phase treatment chamber with the first main surface facing upward; (i) after the step (h), while the semiconductor wafer being set over the second lower electrode with the first main surface facing upward, carrying out a low bias plasma treatment with a self bias of the second lower electrode of 10 V or less on the first main surface under a second gas atmosphere containing an inert gas as one of main components; (j) after the step (i), forming a barrier metal film over the inner surface of the contact hole; and (k) after the step (j), filling the contact hole with a metal containing tungsten as a main component.

18. The method for manufacturing a semiconductor integrated circuit device according to any one of the items 12 to 16, which further includes the steps of: (e) forming a silicon oxide film type premetal interlayer insulation film over the silicon nitride film; (f) opening a contact hole in the premetal interlayer insulation film with the silicon nitride film as an etching stop film; (g) after the step (f), etching the silicon nitride film, thereby to extend the contact hole to the top surface of the silicide film disposed over the source/drain regions; (j) after the step (g), forming a barrier metal film over the inner surface of the contact hole; and (k) after the step (j), filling the contact hole with a metal containing tungsten as a main component.

19. The method for manufacturing a semiconductor integrated circuit device according to the item 17, wherein the inert gas of the step (i) is an argon gas.

20. The method for manufacturing a semiconductor integrated circuit device according to the item 17 or 19, wherein the second gas atmosphere substantially does not contain hydrogen.

21. The method for manufacturing a semiconductor integrated circuit device according to the item 17, 19, or 20, wherein the second gas atmosphere substantially does not contain a hydrogen gas and an ammonia gas.

22. The method for manufacturing a semiconductor integrated circuit device according to the item 17, 19, 20, or 21, wherein the second gas atmosphere substantially does not contain a nitrogen gas.

23. A method for manufacturing a semiconductor integrated circuit device, which includes the steps of: (a) forming a MISFET in a region in the vicinity of a first main surface of a semiconductor wafer, the MISFET having (x1) source/drain regions disposed in a surface region of the first main surface, (x2) a gate insulation film disposed over the first main surface, (x3) a gate electrode including silicon as a main component and disposed over the gate insulation film, and (x4) a silicide film disposed over the source/drain regions; (b) forming a silicon oxide film type premetal interlayer insulation film over the silicon nitride film; (c) opening a contact hole in the premetal interlayer insulation film with the silicon nitride film as an etching stop film; (d) after the step (c), etching the silicon nitride film, thereby to extend the contact hole to the top surface of the silicide film disposed over the source/drain regions; (e) after the step (d), setting the semiconductor wafer over a lower electrode in a gas phase treatment chamber with the first main surface facing upward; (f) after the step (e), while the semiconductor wafer being set over the lower electrode grounded with the first main surface facing upward, carrying out a plasma treatment on the first main surface under a gas atmosphere containing an inert gas as one of main components; (g) after the step (f), forming a barrier metal film over the inner surface of the contact hole; and (h) after the step (g), filling the contact hole with a metal containing tungsten as a main component.

24. The method for manufacturing a semiconductor integrated circuit device according to the item 23, wherein the inert gas is an argon gas.

25. The method for manufacturing a semiconductor integrated circuit device according to the item 23 or 24, wherein the gas atmosphere substantially does not contain hydrogen.

26. The method for manufacturing a semiconductor integrated circuit device according to any one of the items 23 to 25, wherein the first gas atmosphere substantially does not contain a hydrogen gas and an ammonia gas.

27. The method for manufacturing a semiconductor integrated circuit device according to any one of the items 23 to 26, wherein the gas atmosphere substantially does not contain a nitrogen gas.

28. A method for manufacturing a semiconductor integrated circuit device, which includes the steps of: (a) forming a MISFET in a region in the vicinity of a first main surface of a semiconductor wafer, the MISFET having (x1) source/drain regions disposed in a surface region of the first main surface, (x2) a gate insulation film disposed over the first main surface, (x3) a gate electrode including silicon as a main component and disposed over the gate insulation film, and (x4) a silicide film disposed over the source/drain regions; (b) after the step (a), disposing the semiconductor wafer over a first lower electrode in a first gas phase treatment chamber with the first main surface facing upward; (c) after the step (b), while the semiconductor wafer being set over the first lower electrode grounded with the first main surface facing upward, carrying out a plasma treatment on the first main surface under a first gas atmosphere containing an inert gas as one of main components; and (d) after the step (c), while the semiconductor wafer being set over the first lower electrode or a second lower electrode in a second gas phase treatment chamber with the first main surface facing upward, forming a silicon nitride film over the first main surface by a CVD treatment.

29. A method for manufacturing a semiconductor integrated circuit device, which includes the steps of: (a) forming a MISFET in a region in the vicinity of a first main surface of a semiconductor wafer, the MISFET having (x1) source/drain regions disposed in a surface region of the first main surface, (x2) a gate insulation film disposed over the first main surface, (x3) a gate electrode including silicon as a main component and disposed over the gate insulation film, and (x4) a silicide film disposed over the source/drain regions; (b) after the step (a), setting the semiconductor wafer over a first lower electrode in a first gas phase treatment chamber with the first main surface facing upward; (c) after the step (b), while the semiconductor wafer being set over the first lower electrode with the first main surface facing upward, carrying out a low bias plasma treatment with a self bias of the first lower electrode of 20 V or less on the first main surface under a first gas atmosphere containing an inert gas as one of main components; and (d) after the step (c), while the semiconductor wafer being set over the first lower electrode or a second lower electrode in a second gas phase treatment chamber with the first main surface facing upward, forming a silicon nitride film over the first main surface by a CVD treatment.

30. A method for manufacturing a semiconductor integrated circuit device, which includes the steps of: (a) forming a MISFET in a region in the vicinity of a first main surface of a semiconductor wafer, the MISFET having (x1) source/drain regions disposed in a surface region of the first main surface, (x2) a gate insulation film disposed over the first main surface, (x3) a gate electrode including silicon as a main component and disposed over the gate insulation film, and (x4) a silicide film disposed over the source/drain regions; (b) forming a silicon oxide film type premetal interlayer insulation film over the silicon nitride film; (c) opening a contact hole in the premetal interlayer insulation film with the silicon nitride film as an etching stop film; (d) after the step (c), etching the silicon nitride film, thereby to extend the contact hole to the top surface of the silicide film disposed over the source/drain regions; (e) after the step (d), setting the semiconductor wafer over a lower electrode in a gas phase treatment chamber with the first main surface facing upward; (f) after the step (e), while the semiconductor wafer being set over the lower electrode grounded with the first main surface facing upward, carrying out a plasma treatment on the first main surface under a gas atmosphere containing an inert gas as one of main components; (g) after the step (f), while the semiconductor wafer being set over the first lower electrode or a second lower electrode in a second gas phase treatment chamber with the first main surface facing upward, forming a barrier metal film over the inner surface of the contact hole; and (h) after the step (g), filling the contact hole with a metal containing tungsten as a main component.

31. The method for manufacturing a semiconductor integrated circuit device according to any one of the items 1 to 30, wherein the lower end width of the sidewall insulation film of the MISFET is smaller than the depth of the extension region of the MISFET.

32. The method for manufacturing a semiconductor integrated circuit device according to any one of the items 1 to 31, wherein the silicide film is a film containing nickel silicide as a main component.

33. The method for manufacturing a semiconductor integrated circuit device according to any one of the items 1 to 32, wherein the MISFET further has (x5) a sidewall insulation film disposed at the sidewall of the gate electrode, and (x6) an extension region which is a semiconductor region disposed in a region under the sidewall insulation film, and the lower end width of the sidewall insulation film is smaller than the depth of the extension region.

[Explanation of description form, basic terms, and methods in the present application] 1. In the present application, in the following description of embodiments, the description may be divided into a plurality of sections for convenience, if required. However, unless otherwise specified, these sections are not independent of each other, but are respective parts of a single example, in a relation such that one is a detailed explanation of a part of the other, a modification example of a part or the whole, or the like of the other. Further, in principle, the repetitive description of the same parts will be omitted. Whereas, respective constitutional elements in embodiments are not essential, unless otherwise specified, or except for the case where the number is theoretically limited, and unless otherwise apparent from the context.

2. Similarly, in the description of embodiments, and the like, the term "X including A" or the like for the material, composition, or the like does not exclude the one including an element other than A as a main constitutional element unless otherwise specified and unless otherwise apparent from the context. For example, for the component, the term is used to embrace "X including A as a main component", and the like. For example, it is naturally understood that the term "silicon member" or the like herein used is not limited to pure silicon but also embraces a SiGe alloy, other multinary alloys containing silicon as a main component, and other members containing additives, and the like. Similarly, it is naturally understood that the terms "silicon oxide film", "silicon oxide type insulation film", and the like are used to embrace thermal oxide films and CVD oxide films of not only relatively pure undoped silicon dioxide, but also FSG (Fluorosilicate Glass), TEOS-based silicon oxide, SiOC (Silicon Oxicarbide) or Carbon-doped Silicon oxide or OSG (Organosilicate glass), PSG (Phosphorus Silicate Glass), BPSG (Borophosphosilicate Glass), and the like, silica type Low-k insulation films (porous type insulation films) obtained by introducing holes into coating type silicon oxides such as SOG (Spin On Glass), and nano-Clustering Silica: NSC, and the same members as these, composite films with other silicon type insulation films containing these as main constitutional elements, and the like.

Similarly, the term "nickel silicide" herein used generally denotes nickel monosilicide, however, embraces not only relatively pure ones but also alloy and mixed crystal containing nickel monosilicide as a main constitutional element, and the like.

Whereas, the term "silicon nitride", as herein used, contains a relatively large amount of hydrogen, or the like, in actuality. Therefore, the term denotes a material of a silicon nitride type containing silicon nitride within the range actually used in the semiconductor field as a main constitutional element (i.e., typical example of non-oxidized silicon type inorganic insulation film). Incidentally, even the materials of the non-oxidized silicon type may contain oxygen in such a trace amount as not to inhibit the action as an etching stop film.

3. Similarly, preferable examples are shown for drawings, position, attributes, and the like. However, it is naturally understood that the present invention is not strictly limited thereto unless otherwise specified, and unless otherwise apparent from the context.

4. Further, also when a reference is made to a specific numerical value or quantity, the numerical value may be a numerical value greater than the specific numerical value or a numerical value less than the specific numerical value, unless otherwise specified, except for the case where the number is theoretically limited to the numerical value, and unless otherwise apparent from the context.

5. The term "wafer", as herein used, generally denotes a single crystal silicon wafer for forming a semiconductor integrated circuit device (also a semiconductor device or an electron device, as well) thereon. However, it is naturally understood that the term embraces a composite wafer of an insulation substrate such as an epitaxial wafer, a SOI substrate, or a LCD glass substrate, and a semiconductor layer or the like.

6. The term "non-bias plasma" or "low bias plasma" denotes a plasma treatment corresponding to a treatment by a plasma treatment device in which a lower electrode (electrode corresponding to the wafer stage) are grounded (i.e., Vdc of lower electrode=0 V), and a plasma is excited by the upper electrode (including an antenna for RF, microwave, or the like), or a plasma treatment device involving self bias (Vdc) of the lower electrode equivalent thereto. Generally, the self bias is a negative value, but fluctuates complicatedly. Thus, the self bias is expressed in absolute value unless otherwise specified in the present application. Incidentally, the self bias of the lower electrode and the self bias of the wafer are generally not the same.

On the other hand, a general "bias plasma" is used in sputtering etching or anisotropic dry etching. Generally, the self bias value of the lower electrode shows a value as high as about 50 V to 300 V.

Therefore, the term "non-bias plasma" or "low bias plasma", as herein used, denotes that the lower electrode is substantially grounded, or the self bias (Vdc) of the lower electrode is substantially about 0 V to 10 V.

Details of Embodiments

Below, embodiments of the present invention will be described in details by reference to the accompanying drawings. Incidentally, in all the drawings for illustrating the embodiments, the same members having the same functions are given the same reference numerals and signs, and a repetitive description thereon will be omitted. Further, in the following embodiments, unless particularly required, the description of the equal or same parts will not be repeated in principle.

Further, in the drawings for use in embodiments, even in a cross-sectional view, hatching may be omitted for making the view easy to see. Whereas, even in a plan view, hatching may be applied thereto for making the view easy to see.

Incidentally, removal of the natural oxide film on the top side of the metal silicide film such as nickel silicide, or the like is described in details in the prior application by the present inventors, namely, Japanese Patent Application No. 2007-259355 (filed on Oct. 3, 2007).

1. Outline description of a wafer processing flow in a method for manufacturing a semiconductor integrated circuit device of one embodiment of the present application (mainly FIGS. 1 through 10)

A description will be given by reference to the drawings of the manufacturing steps of a semiconductor integrated circuit device of one embodiment of the present invention. FIGS. 1 to 10 are each a cross-sectional view of an essential part during the manufacturing step of a semiconductor integrated circuit device which is one embodiment of the present invention, such as a semiconductor integrated circuit device having a CMISFET (Complementary Metal Insulator Semiconductor Field Effect Transistor).

First, as shown in FIG. 1, a semiconductor substrate (semiconductor wafer) 1 including p type single crystal silicon having a specific resistance of, for example, about 1 to 10 Ωcm is prepared. Then, in a device surface 1a (first main surface) of the semiconductor substrate 1, an element isolation region 2 is formed. The element isolation region 2 includes an insulator such as silicon oxide, and is formed with, for example, a STI (Shallow Trench Isolation) process or a LOCOS (Local Oxidization of Silicon) process. The element isolation region 2 can be formed by, for example, an insulation film embedded in a groove (element isolation groove) 2a formed in the semiconductor substrate 1.

Then, as shown in FIG. 2, a p type well 3 and an n type well 4 are formed to a prescribed depth from the main surface of the semiconductor substrate 1. The p type well 3 can be formed in the following manner, or with other processes. With a photoresist film (not shown) covering a p channel type MISFET forming region as an ion implantation blocking mask, p type impurities, such as boron (B), are ion implanted into a portion of the semiconductor substrate 1 in an n channel type MISFET forming region. Whereas, the n type well 4 can be formed in the following manner, or with other processes.

With another photoresist film (not shown) covering an n channel type MISFET forming region as an ion implantation blocking mask, n type impurities, such as phosphorus (P) or arsenic (As), are ion implanted into a portion of the semiconductor substrate 1 in the p channel type MISFET forming region.

Then, by, for example, wet etching using an aqueous hydrofluoric acid (HF) solution, the surface of the semiconductor substrate 1 is cleaned (washed). Then, over the surface of the semiconductor substrate 1 (i.e., the surface of the p type well 3 and n type well 4), a gate insulation film 5 is formed. The gate insulation film 5 includes, for example, a thin silicon oxide film, and can be formed by, for example, a thermal oxidation process.

Then, over the semiconductor substrate 1 (i.e., over the gate insulation film 5 of the p type well 3 and the n type well 4), a silicon film (conductor film) 6 such as a polycrystal silicon film is formed as a conductor film for gate electrode formation. The n channel type MISFET forming region (region to serve as a gate electrode 6a described later) of the silicon film 6 has been formed as a low-resistance n type semiconductor film (doped polysilicon film) by ion implantation of n type impurities, such as phosphorus (P) or arsenic (As), with a photoresist film (not shown) as a mask or by other processes. Whereas, the p channel type MISFET forming region (region to serve as a gate electrode 6b described later) of the silicon film 6 has been formed as a low-resistance p type semiconductor film (doped polysilicon film) by ion implantation of p type impurities, such as phosphorus (B), with another photoresist film (not shown) as a mask, or other processes. Alternatively, the silicon film 6, which has been an amorphous silicon film upon deposition, can be changed into a polycrystal silicon film by a heat treatment after deposition (after ion implantation).

Then, as shown in FIG. 3, the silicon film 6 is patterned by using a photolithography process and a dry etching process, thereby to form gate electrodes 6a and 6b.

The gate electrode 6a to serve as a gate electrode of the n channel type MISFET includes polycrystalline silicon doped with n type impurities (n type semiconductor film, doped polysilicon film), and is formed over the p type well 3 via the gate insulation film 5. Namely, the gate electrode 6a is formed over the gate insulation film 5 of the p type well 3. Whereas, the gate electrode 6b to serve as a gate electrode of the p channel type MISFET includes polycrystalline silicon doped with p type impurities (p type semiconductor film, doped polysilicon film), and is formed over the n type well 4 via the gate insulation film 5. Namely, the gate electrode 6b is formed over the gate insulation film 5 of the n type well 4. Each gate length of the gate electrodes 6a and 6b can be changed, if required, but can be set at, for example, about 40 nm.

Figure 4:
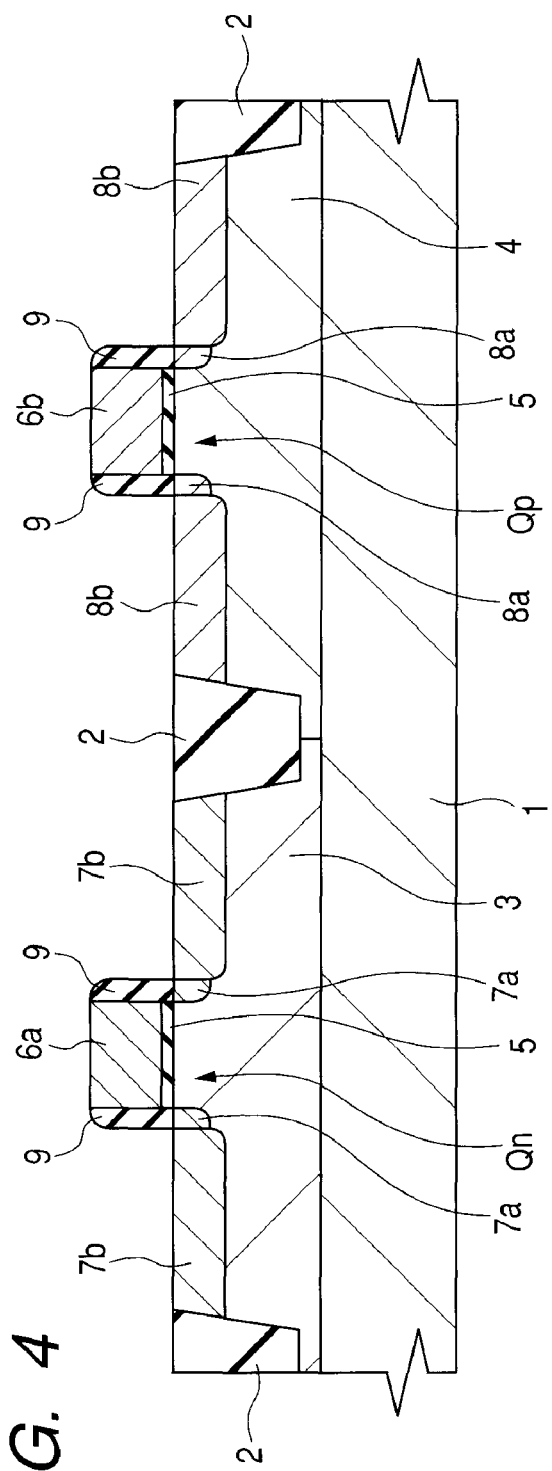
FIG. 4 is a cross sectional view of an essential part during a manufacturing step of the semiconductor integrated circuit device following FIG. 3.

Then, as shown in FIG. 4, in the regions on the opposite sides of the gate electrode 6a of the p type well 3, n type impurities, such as phosphorus (P) or arsenic (As), are ion implanted, thereby to form (a pair of) n$^-$ type semiconductor regions 7a. In regions on the opposite sides of the gate electrode 6b of the n type well 4, p type impurities, such as boron (B), are ion implanted, thereby to form (a pair of) p$^-$ type semiconductor regions 8a. Each depth (junction depth) of the n$^-$ type semiconductor regions 7a and the p$^-$ type semiconductor regions 8a can be set at, for example, about 40 nm.

Then, over the sidewalls of the gate electrodes 6a and 6b, sidewall spacers or sidewalls (sidewall insulation film) 9 including, for example, silicon oxide or silicon nitride, or a lamination film of the insulation films thereof, or the like are formed as an insulation film. The sidewall 9 can be formed in the following manner. For example, over the semiconductor substrate 1, a silicon oxide film or a silicon nitride film, or a lamination film thereof is deposited. The silicon oxide film or the silicon nitride film, or the lamination film thereof is anisotropically etched by a RIE (Reactive Ion Etching) process, or the like.

After formation of the sidewall 9, (a pair of) the n⁺ type semiconductor regions 7b (source and drain) are formed in the following manner. For example, in the regions on the opposite sides of the gate electrode 6a and the sidewall 9 of the p type well 3, n type impurities, such as phosphorus (P) or arsenic (As), are ion implanted. Whereas, (a pair of) the p⁺ type semiconductor regions 8b (source and drain) are formed in the following manner. For example, the regions on the opposite sides of the gate electrode 6b and the sidewall 9 of the n type well 4, p type impurities, such as boron (B), are ion implanted. It is acceptable whether the n⁺ type semiconductor region 7b is formed first, or the p⁺ type semiconductor region 8b is formed first. It is also possible to perform an annealing treatment for activating the introduced impurities after ion implantation. Each depth (junction depth) of the n⁺ type semiconductor region 7b and the p⁺ type semiconductor region 8b can be set at, for example, about 80 nm.

The n⁺ type semiconductor region 7b is higher in impurity concentration than the n− type semiconductor region 7a. The p⁺ type semiconductor region 8b is higher in impurity concentration than the p⁻ type semiconductor region 8a. As a result, the n type semiconductor region (impurity diffusion layer) serving as the source or drain of the n channel type MISFET is formed of the n⁺ type semiconductor region (impurity diffusion layer) 7b and the n⁻ type semiconductor region 7a. The p type semiconductor region (impurity diffusion layer) serving as the source or drain of the p channel type MISFET is formed of the p⁺ type semiconductor region (impurity diffusion layer) 8b and the p⁻ type semiconductor region 8a. Therefore, the source/drain regions of the n channel type MISFET and the p channel type MISFET have a LDD (Lightly doped Drain) structure. The n⁻ type semiconductor region 7a is formed in a self-aligned manner with respect to the gate electrode 6a. The n⁺ type semiconductor region 7b is formed in a self-aligned manner with respect to the sidewall 9 formed over the sidewall of the gate electrode 6a. The p⁻ type semiconductor region 8a is formed in a self-aligned manner with respect to the gate electrode 6b. The p⁺ type semiconductor region 8b is formed in a self-aligned manner with respect to the sidewall 9 formed over the sidewall of the gate electrode 6b.

Thus, in the p type well 3, the n channel type MISFET (Metal Insulator Semiconductor Field Effect Transistor) Qn is formed. In the n type well 4, the p channel type MISFET (Metal Insulator Semiconductor Field Effect Transistor) Qp is formed. As a result, the structure of FIG. 4 can be obtained. Incidentally, the n⁺ type semiconductor region 7b (first semiconductor region) can be regarded as the semiconductor region for source or drain of the n channel type MISFET Qn. The p⁺ type semiconductor region 8b (first semiconductor region) can be regarded as semiconductor region for source or drain of the p channel type MISFET Qp.

Then, with a salicide (Self Aligned Silicide) technology, over the surfaces of the gate electrode 6a and the source/drain regions (herein, the n⁺ type semiconductor regions 7b) of the n channel type MISFET Qn, and the surfaces of the gate electrode 6b and the source/drain regions (herein, the p⁺ type semiconductor regions 8b) of the p channel type MISFET Qp, a low resistance metal silicide layer (corresponding to a metal silicide layer 13 described later) is formed. Below, a description will be given to the steps of forming the metal silicide layer.

Figure 5:
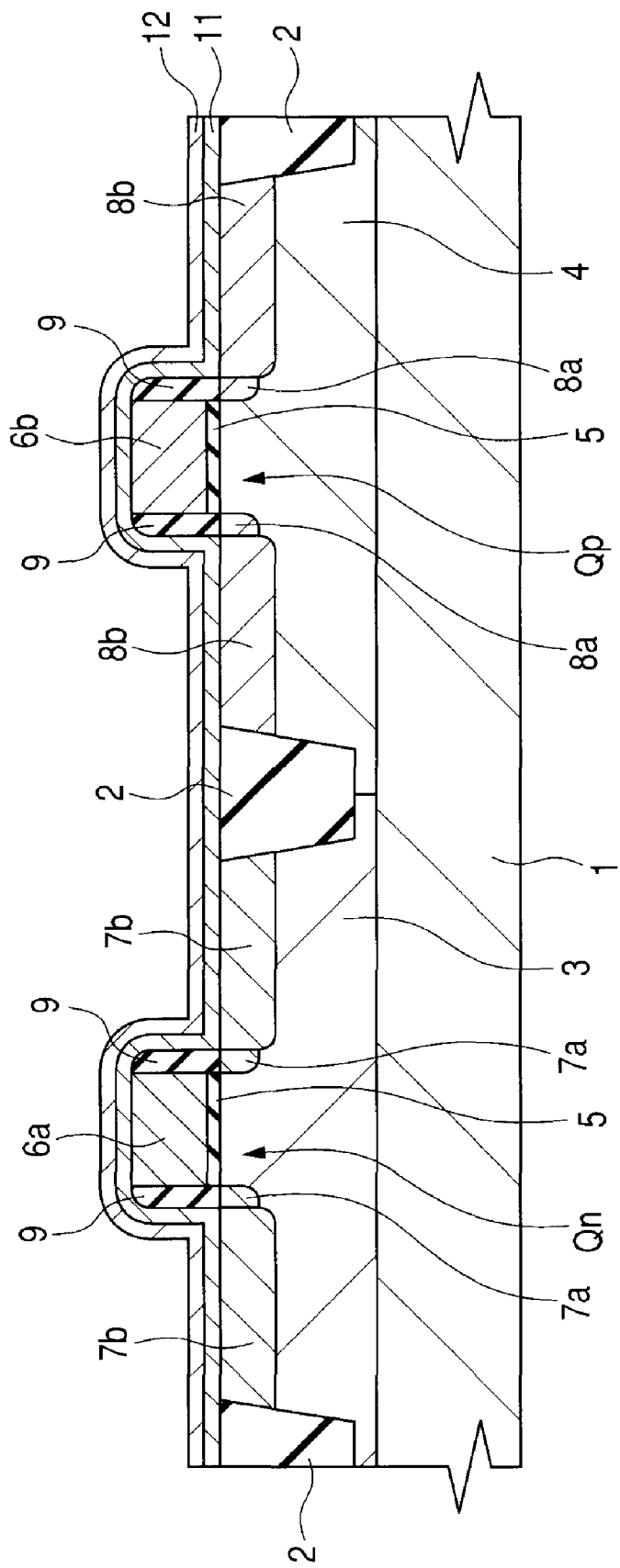
FIG. 5 is a cross sectional view of an essential part during a manufacturing step of the semiconductor integrated circuit device following FIG. 4.

After the structure of FIG. 4 is obtained in the foregoing manner, as shown in FIG. 5, the surfaces of the gate electrodes 6a and 6b, the n⁺ type semiconductor region 7b and the p⁺ type semiconductor region 8b are exposed. Then, over the main surface (the entire surface) of the semiconductor substrate 1 including over the gate electrodes 6a and 6b, the n⁺ type semiconductor regions 7b and the p⁺ type semiconductor regions 8b, a metal film 11 is formed (deposited) in such a manner as to cover the gate electrodes 6a and 6b with, for example, a sputtering process. Then, a barrier film 12 is formed (deposited) over the metal film 11.

Further, before depositing the metal film 11 over the semiconductor substrate 1, a dry cleaning treatment using at least any one of a HF gas, a NF₃ gas, a NH₃ gas, or a H₂ gas is performed, thereby to remove the natural oxide film over the surfaces of the gate electrodes 6a and 6b, the n⁺ type semiconductor regions 7b, and the p⁺ type semiconductor regions 8b. Then, without exposing the semiconductor substrate 1 in air (in an oxygen-containing atmosphere), the formation step of the metal film 11 and the formation step of the barrier film 12 are performed. This procedure is more preferable.

The metal film 11 includes, for example, a nickel (Ni) film. The thickness (deposited film thickness) thereof can be set at, for example, about 10 nm. Other than a Ni (nickel) film, for example, a nickel alloy film such as a Ni—Pt alloy film (an alloy film of Ni and Pt), a Ni—V alloy film (an alloy film of Ni and V), a Ni—Pd alloy film (and alloy film of Ni and Pd), a Ni—Yb alloy film (an alloy film of Ni and Yb) or a Ni—Er alloy film (an alloy film of Ni and Er) can be used as the metal film 11. When the lower end width of the sidewall insulation film is smaller than the depth of the extension region, the metal film 11 is more preferably a nickel alloy film. The barrier film 12 includes, for example, a titanium nitride (TiN) film or a titanium (Ti) film. The thickness (deposited film thickness) thereof can be set at, for example, about 15 nm. The barrier film 12 is provided over the metal film 11 for prevention of oxidation of the metal film 11, control of the stress acting on the semiconductor substrate 1, or the like.

After formation of the metal film 11 and the barrier film 12, the semiconductor substrate 1 is subjected to a first heat treatment (annealing treatment). This causes the selective reaction between the polycrystal silicon film forming the gate electrodes 6a and 6b, and the metal film 11, and between single crystal silicon forming the n⁺ type semiconductor region 7b and the p⁺ type semiconductor region 8b, and the metal film 11. As a result, a metal silicide layer 13 which is a metal/semiconductor reaction layer is formed. The top parts (upper layer parts) of the gate electrodes 6a and 6b, the n⁺ type semiconductor regions 7b and the p⁺ type semiconductor regions 8b and the metal film 11 react with each other, thereby to form the metal silicide layer 13. Therefore, the metal silicide layer 13 is formed over respective surfaces (upper layer parts) of the gate electrodes 6a and 6b, the n⁺ type semiconductor regions 7b, and the p⁺ type semiconductor regions 8b. The first heat treatment for forming the metal silicide layer 13 is preferably performed under ordinary pressure filled with an inert gas (e.g., an argon (Ar) gas, a helium (He) gas, or a nitrogen (N₂) gas) atmosphere.

Then, the device surface 1a of the wafer 1 is subjected to a wet washing treatment, thereby to remove the barrier film 12 and the unreacted metal film 11 (i.e., portions of the metal film 11 unreacted with the gate electrodes 6a and 6b, the n⁺ type semiconductor regions 7b, or the p⁺ type semiconductor regions 8b). At this step, over the surfaces of the gate electrodes 6a and 6b, the n⁺ type semiconductor regions 7b, and the p⁺ type semiconductor regions 8b, the metal silicide layer 13 is left. The wet washing treatment can be carried out by wet washing using sulfuric acid, wet washing using sulfuric acid and oxygenated water, or the like. In this manner, the structure of FIG. 6 can be obtained.

Then, the semiconductor substrate 1 is subjected to a second heat treatment (annealing treatment). The second heat treatment is performed at a higher heat treatment temperature than the heat treatment temperature of the first heat treatment temperature. The second heat treatment is preferably performed under ordinary pressure, filled with an inert gas (e.g., an argon (Ar) gas, a helium (He) gas, or a nitrogen ($N_2$) gas) atmosphere.

As described above, by the first heat treatment, (silicon forming) the gate electrodes 6a and 6b, the $n^+$ type semiconductor regions 7b, and the $p^+$ type semiconductor regions 8b, and the metal film 11 are allowed to selectively react with each other, thereby to form the metal silicide layer 13. At a stage in which the first heat treatment has been performed, it is preferable that the metal silicide layer 13 assumes the MSi (metal monosilicide) phase, but does not assume the $M_2Si$ (dimetal silicide) phase, or the $MSi_2$ (metal disilicide) phase. Then, by performing the second heat treatment, it is possible to stabilize the MSi phase metal silicide layer 13.

Namely, by the first heat treatment, the MSi phase metal silicide layer 13 is formed. The metal silicide layer 13 still remains in the MSi phase even upon performing the second heat treatment. However, by performing the second heat treatment, the composition of the inside of the metal silicide layer 13 is made more uniform. Thus, the composition ratio of the metal element M and Si in the metal silicide layer 13 comes closer to the stoichiometric ratio of 1:1, so that the metal silicide layer 13 can be stabilized. Further, when portions of the $M_2Si$ phase have been formed in the metal silicide layer 13 by the first heat treatment, the portions of the $M_2Si$ phase can be transformed into the MSi phase by the second heat treatment. Incidentally, the MSi phase has a lower resistivity than those of the $M_2Si$ phase and the $MSi_2$ phase. Also in the second heat treatment, or later (until the completion of manufacturing of the semiconductor integrated circuit device), the metal silicide layer 13 is still held in the low resistance MSi phase. In the manufactured semiconductor integrated circuit device (e.g., even in a semiconductor chip state resulting from division of the semiconductor substrate 1 into individual pieces), the metal silicide layer 13 is in the low resistance MSi phase.

Incidentally, in this embodiment, the metal element forming the metal film 11 is expressed as M in the chemical formula, or "metal" in the alphabetical expression. For example, when the metal film 11 is a nickel (Ni) film, the M (metal element M forming the metal film 11) is Ni. The MSi (metal monosilicide) is NiSi(nickel monosilicide). The $M_2Si$ (dimetal silicide) is $Ni_2Si$ (dinickel silicide). The $MSi_2$ (metal disilicide) is $NiSi_2$ (nickel disilicide). When the metal film 11 is a Ni—Pt alloy film ($Ni_{0.95}Pt_{0.05}$ alloy film) in which Ni is in an amount of 98 at %, and Pt is in an amount of 5 at %, the M (the metal element M forming the metal film 11) is Ni and Pt (provided that the M is $Ni_{0.95}Pt_{0.05}$ in view of the composition ratio of Ni and Pt). The MSi is $Ni_{0.95}Pt_{0.05}Si$, the $M_2Si$ is $(Ni_{0.95}Pt_{0.05})_2Si$, and the $MSi_2$ is $Ni_{0.95}Pt_{0.05}Si_2$. When the metal film 11 is a Ni—Pd alloy film ($Ni_{0.99}Pt_{0.01}$ alloy film) where Ni is in an amount of 99 at % and Pd is in an amount of 1 at %, the M (metal element M forming the metal film 11) is Ni and Pd (provided that the M is $Ni_{0.99}Pd_{0.01}$ in view of the composition ratio of Ni and Pd). The MSi is $Ni_{0.99}Pd_{0.01}Si$, the $M_2Si$ is $(Ni_{0.99}Pd_{0.01})_2Si$, and the $MSi_2$ is $Ni_{0.99}Pd_{0.01}Si_2$. The case where the metal film 11 is an alloy film with another composition can also be similarly considered.

Thus, over the surfaces (upper layer parts) of the gate electrode 6a and the source/drain regions ($n^+$ type semiconductor region 7b) of the n channel type MISFET Qn, and the surfaces (upper layer parts) of the gate electrode 6b and the source/drain regions ($p^+$ type semiconductor regions 8b) of the p channel type MISFET Qp, the metal silicide layer 13 including MSi (metal monosilicide) is formed. Whereas, although depending upon the film thickness of the metal film 11, when the film thickness of the metal film 11 is, for example, about 10 nm, the film thickness of the metal silicide layer 13 is, for example, about 20 nm.

Figure 7:
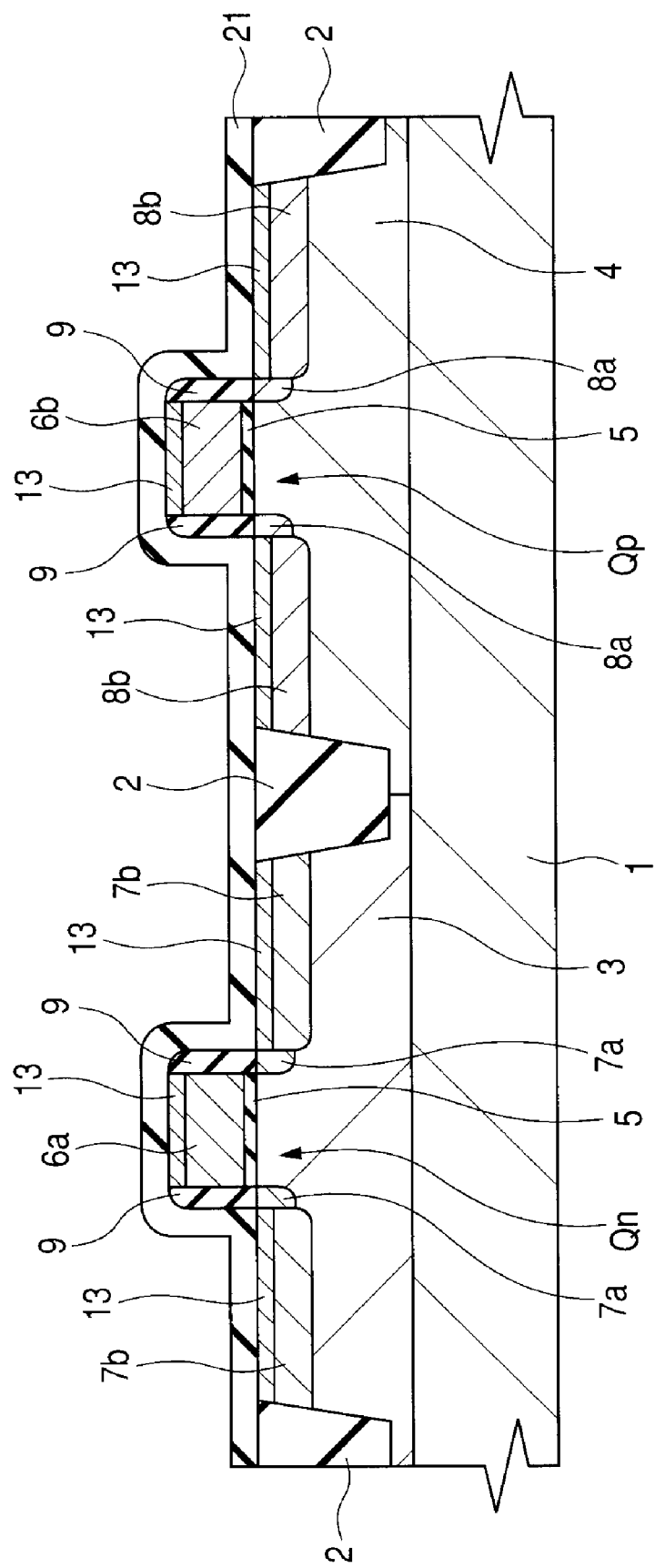
FIG. 7 is a cross sectional view of an essential part during a manufacturing step of the semiconductor integrated circuit device following FIG. 6.

Then, as shown in FIG. 7, over the main surface of the semiconductor substrate 1, the insulation film 21 (first insulation film) is formed. Namely, the insulation film 21 is formed over the semiconductor substrate 1 including over the metal silicide layer 13 in such a manner as to cover the gate electrodes 6a and 6b. The insulation film 21 includes a silicon nitride film, and is formed with a plasma CVD (CHEMICAL VAPOR DEPOSITION) process. The formation step of the insulation film 21 will be described in more details later.

Figure 8:
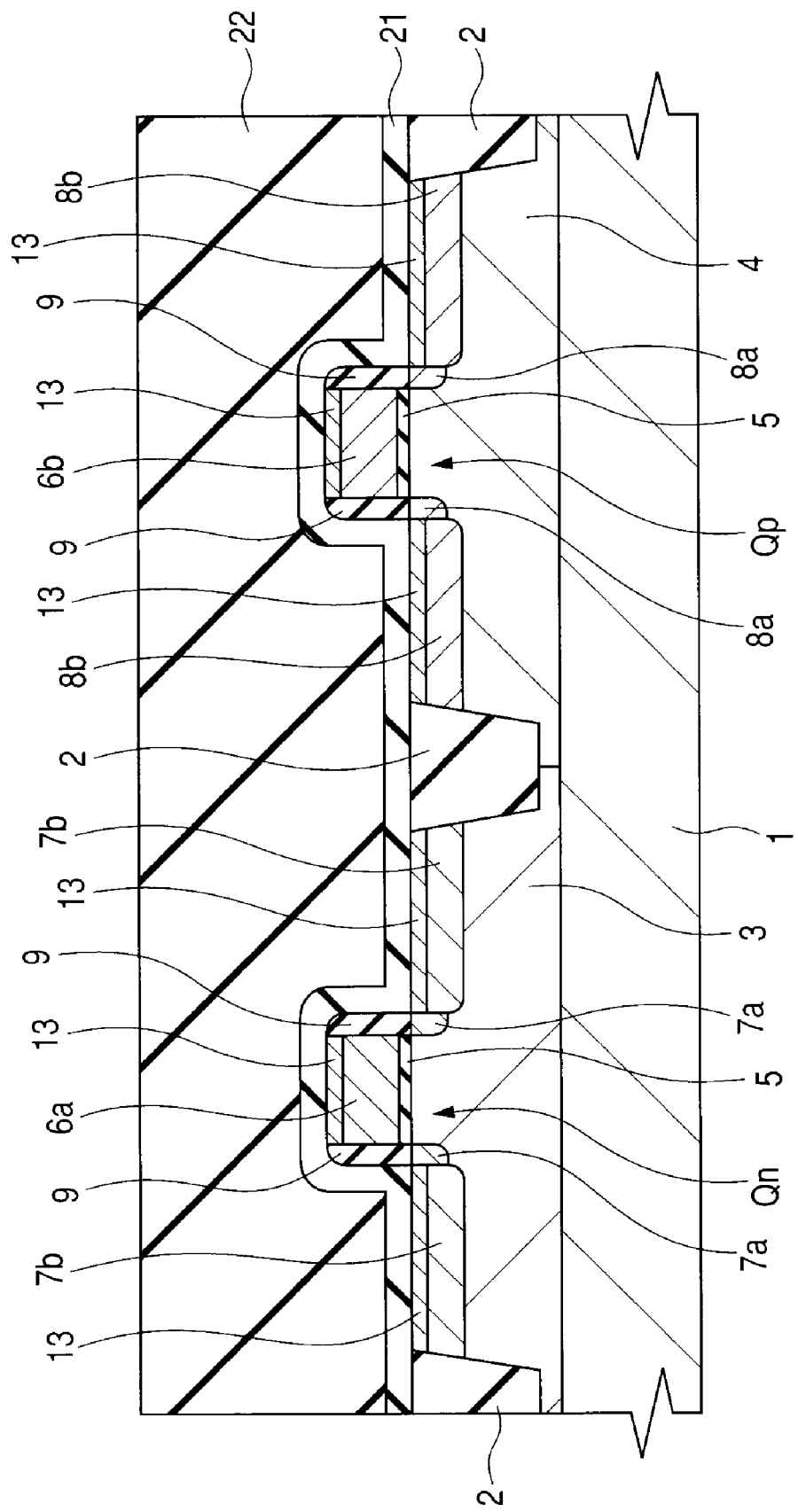
FIG. 8 is a cross sectional view of an essential part during a manufacturing step of the semiconductor integrated circuit device following FIG. 7.

Then, as shown in FIG. 8, over the insulation film 21, an insulation film 22 thicker than the insulation film 21 is formed. The insulation film 22 includes, for example, a silicon oxide film, and can be formed with a plasma CVD process or the like, using TEOS (Tetraethoxysilane, or also referred to as Tetra Ethyl Ortho Silicate). As a result, the interlayer insulation film including the insulation films 21 and 22 is formed. Then, by polishing the surface of the insulation film 22 with a CMP process, or the like, the top surface of the insulation film 22 is planarized. Even when an uneven shape has been formed in the surface of the insulation film 21 due to the base step, the surface of the insulation film 22 is polished with a CMP process. This can provide an interlayer insulation film with a planarized surface.

Figure 9:
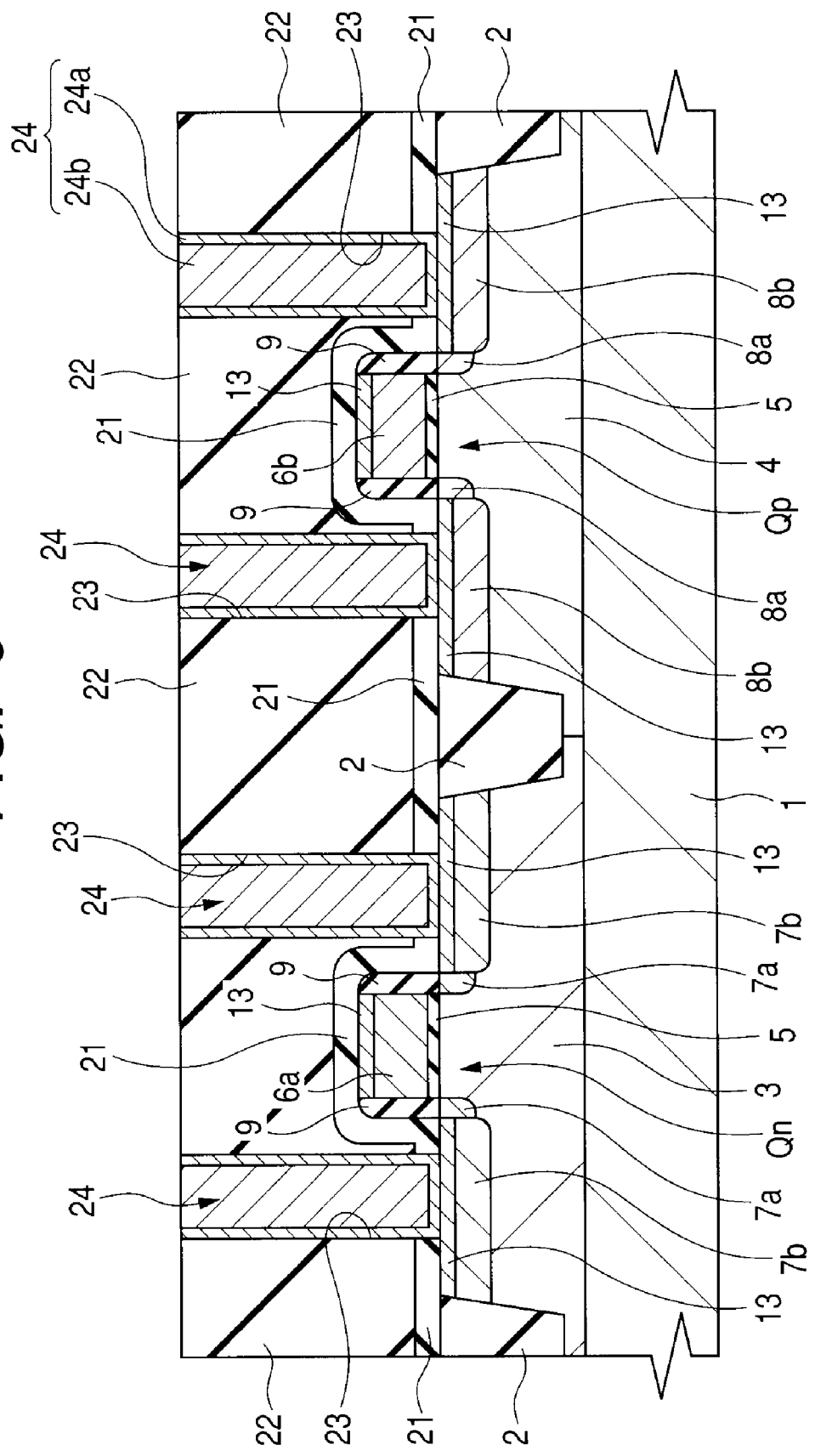
FIG. 9 is a cross sectional view of an essential part during a manufacturing step of the semiconductor integrated circuit device following FIG. 8.

Then, as shown in FIG. 9, using a photoresist pattern (not shown) formed over the insulation film 22 as an etching mask, the insulation films 22 and 21 are dry etched, thereby to form contact holes (through holes, holes) 23 in the insulation films 21 and 22.

At this step, first, under the conditions under which the insulation film 22 is more likely to be etched than the insulation film 21 (i.e., under the etching conditions under which the etching rate of the insulation film 22 is larger than the etching rate of the insulation film 21), the insulation film 22 is dry etched. Thus, the insulation film 21 is allowed to function as an etching stop film, thereby to form contact holes 23 in the insulation film 22. Examples of the gas atmosphere at this step may include mixed gas atmospheres containing relatively large quantity of diluted gases (argon and helium), perfluorocarbon type etching gases (such as $C_4F_8$, $C_5F_8$, $C_4F_{10}$, $C_3F_8$, and $C_5F_5$), and other additive gases (such as oxygen and nitrogen), and the like.

At this stage, the contact holes 23 penetrate through the insulation film 22, but does not penetrate through the insulation film 21. Etching is stopped at the insulation film 21, so that at least a part of the insulation film 21 remains at the bottom of each contact hole 23. Then, under the conditions under which the insulation film 21 is more likely to be etched than the insulation film 22 (i.e., the etching conditions under which the etching rate of the insulation film 21 is larger than the etching rate of the insulation film 22), the insulation film 21 at the bottom of each contact hole 23 is dry etched, and removed (generally, there is used a mixed gas atmosphere containing a fluorine-containing etching gas such as $CF_4$, $CHF_3$, $CH_2F_2$, or $NF_3$, and other additive gases such as oxygen). As a result, the insulation film 21 is completely removed at the bottom of each contact hole 23, so that the contact hole 23 penetrates through the insulation films 22 and 21. Thus, at the bottom of each contact hole 23, there are exposed portions of the main surface of the semiconductor substrate 1, such as portions of the metal silicide layer 13 over the surfaces of the $n^+$ type semiconductor regions 7b and the $p^+$ type semiconductor regions 8b, and portions of the metal silicide layer 13 over the surfaces of the gate electrodes 6a and 6b.

Then, in the contact hole 23, a plug including tungsten (W) or the like (conductor part for coupling, a filling plug, or a filling conductive part) 24 is formed. In order to form the plug 24, for example, over the insulation film 22 including the inside (over the bottom and the sidewall) of the contact hole 23, a barrier conductor film 24a (e.g., a titanium film, a titanium nitride film, or a lamination film thereof) is formed with a plasma CVD process or the like. Then, a main conductor film 24b including a tungsten film or the like is formed over the barrier conductor film 24a with a CVD process, or the like in such a manner as to fill the contact hole 23. Thus, the unnecessary portions of the main conductor film 24b and the barrier conductor film 24a over the insulation film 22 are removed with a CMP process, an etch back process, or the like. As a result, a plug 24 including the remaining portions of the main conductor film 24b and the barrier conductor film 24a in the contact hole 23 can be formed. The plug 24 formed over the gate electrode 6a or 6b, the $n^+$ type semiconductor region 7b, or the $p^+$ type semiconductor region 8b is in contact with, and is electrically coupled with the portions of the metal silicide layer 13 over the surface of the gate electrode 6a or 6b, the $n^+$ type semiconductor region 7b, or the $p^+$ type semiconductor region 8b at the bottom thereof.

Figure 10:
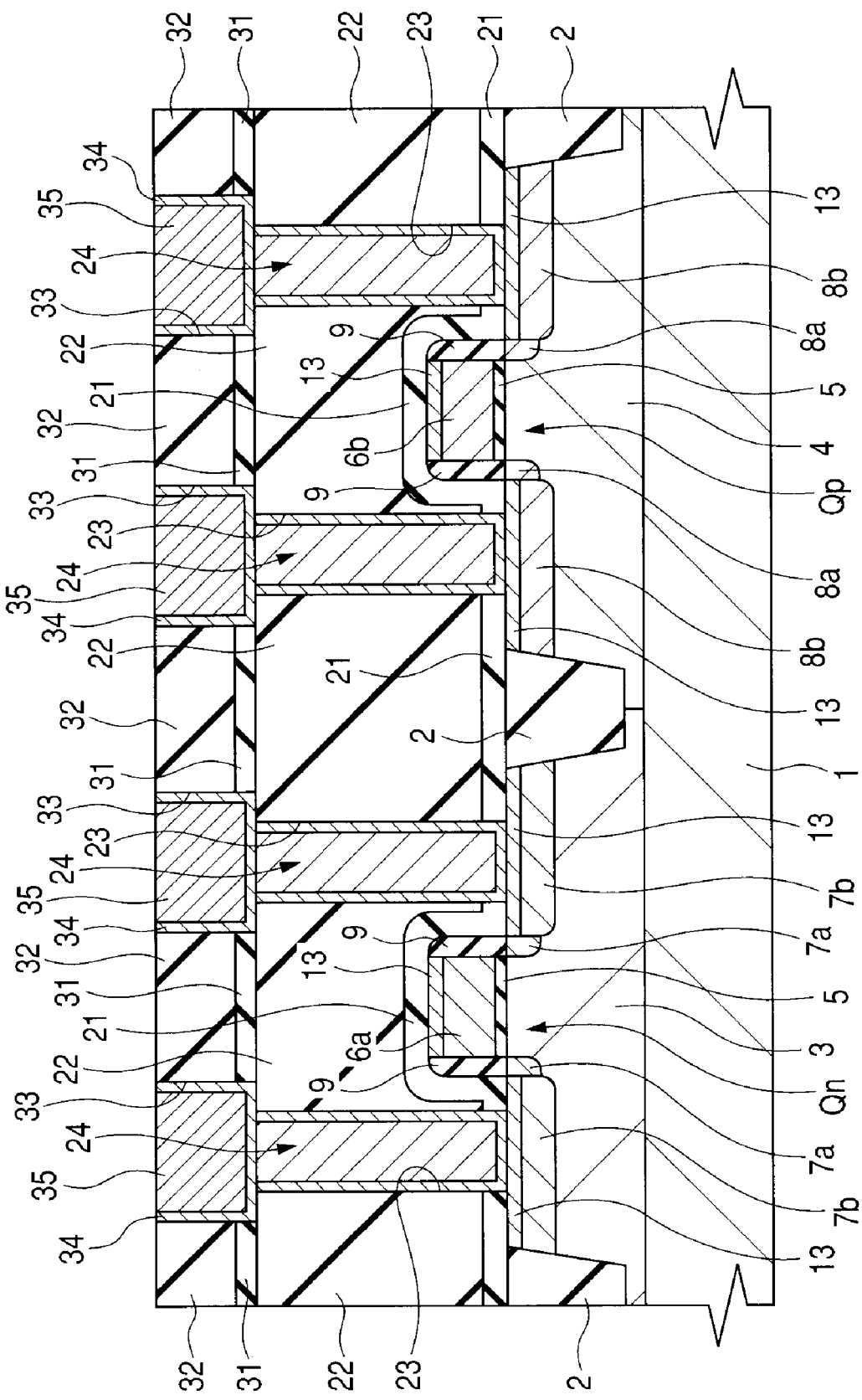
FIG. 10 is a cross sectional view of an essential part during a manufacturing step of the semiconductor integrated circuit device following FIG. 9.

Then, as shown in FIG. 10, over the insulation film 22 including the plugs 24 embedded therein, a stopper insulation film 31 and an insulation film 32 for wiring formation are successively formed. The stopper insulation film 31 is a film serving as an etching stopper for grooving the insulation film 32, and a material having an etching selectivity with respect to the insulation film 32 is used. The stopper insulation film 31 can be a silicon nitride film formed with, for example, a plasma CVD process. The insulation film 32 can be a silicon oxide film formed with, for example, a plasma CVD process. Incidentally, in the stopper insulation film 31 and the insulation film 32, a first layer wiring described next is formed.

Then, the first layer wiring will be formed with a single damascene method. First, by dry etching using a resist pattern (not shown) as a mask, in prescribed portions of the insulation film 32 and the stopper insulation film 31, wiring grooves 33 are formed. Then, over the main surface of the semiconductor substrate 1 (i.e., over the insulation film 32 including over the bottom and the sidewall of each wiring groove 33), a barrier conductor film (barrier metal film) 34 is formed. For the barrier conductor film 34, for example, a titanium nitride film, a tantalum film, or a tantalum nitride film can be used. Subsequently, with a CVD process, a sputtering process, or the like, over the barrier conductor film 34, a copper seed layer is formed. Further, with an electroplating process, or the like, a copper plated film is formed over the seed layer, so that the insides of the wiring grooves 33 are filled with the copper plated film. Then, portions of the copper plated film, the seed layer, and the barrier metal film 34 in regions other than the wiring grooves 33 are removed with a CMP process. As a result, the first layer wiring 35 including copper embedded in the wiring grooves 33 as a main conductive material is formed. The wiring 35 is electrically coupled with the $n^+$ type semiconductor regions 7b and the $p^+$ type semiconductor regions 8b for sources or drains, and the gate electrodes 6a and 6b of the n channel type MISFET Qn and the p channel type MISFET Qp, and the like via the plugs 24. Subsequently, a second layer wiring is formed with a dual damascene method, which will not be shown or described herein.

2. Explanation of gas phase treatment device for use in inert gas plasma treatment or the like on silicide surface in the method for manufacturing a semiconductor integrated circuit device which is one embodiment of the present application (mainly FIGS. 11 to 13)

Then, the formation step of the insulation film 21 will be described in more details.

Figure 11:
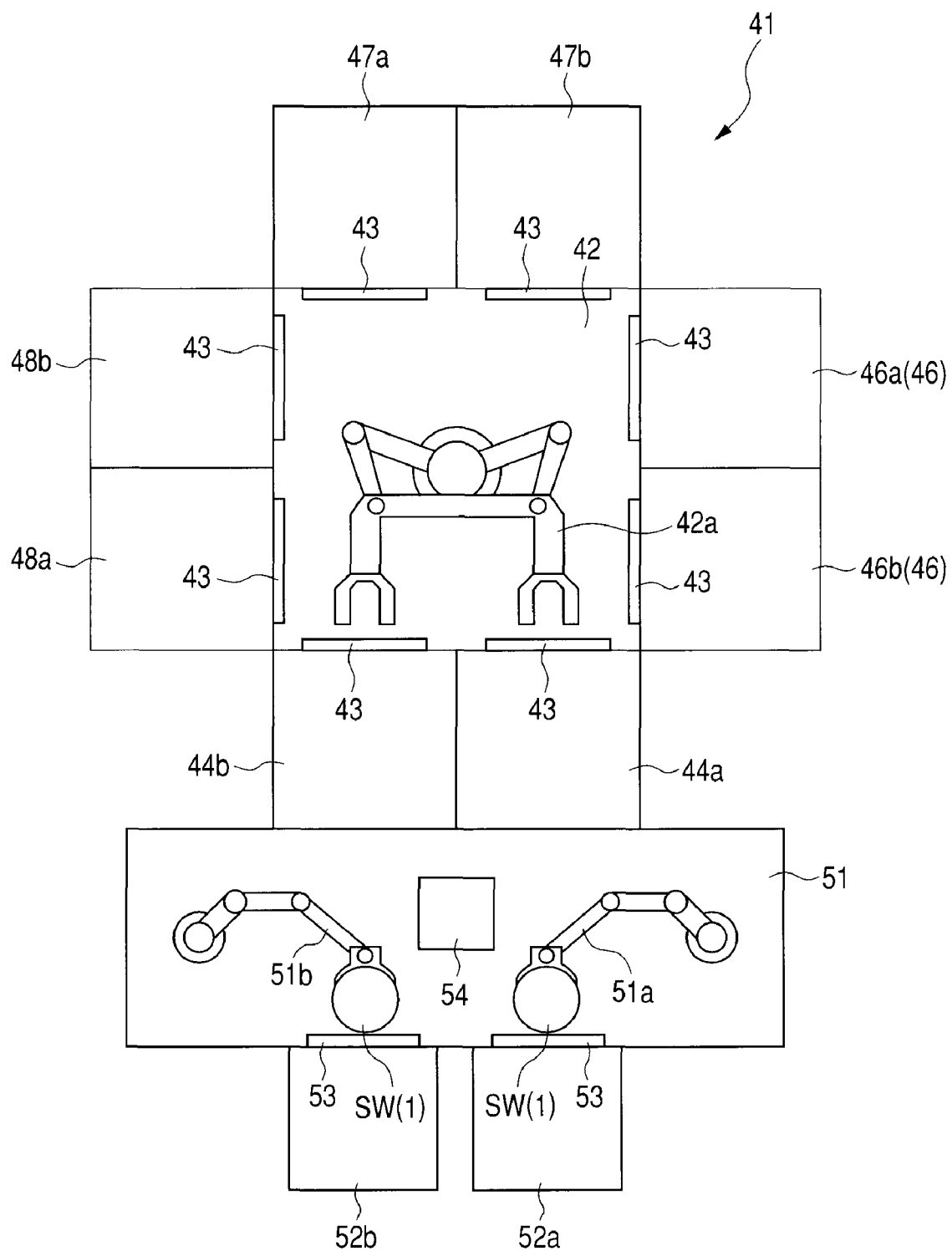
FIG. 11 is a schematic plan view showing a deposition device of a silicon nitride film for use in a manufacturing step of a semiconductor integrated circuit device which is one embodiment of the present invention.

FIG. 11 is a schematic plan view showing one example of a deposition device 41 usable for formation of the insulation film 21. For the deposition of the insulation film 21, a multi-chamber type single wafer deposition device 41 (multi-chamber type single wafer gas phase treatment device) of FIG. 11 can be used. Each chamber can be configured to have, if required, a deposition chamber (a plasma CVD chamber, a thermal CVD chamber, or a sputtering deposition chamber) and, another gas phase treatment chamber (a plasma gas phase treatment chamber or a non-plasma gas phase treatment chamber), or the like.

As shown in FIG. 11, the deposition device 41 has a transfer chamber 42, and, around the transfer chamber 42, load lock chambers 44a and 44b, and chambers (treatment chambers and reaction chambers) 46a, 46b, 47a, 47b, 48a, and 48b disposed via gate valves 43 which are opening/closing means. Further, in the deposition device 41, on the opposite side of the load lock chambers 44a and 44b from the transfer chamber 42, a wafer carry in/out chamber 51 is disposed. On the opposite side of the wafer carry in/out chamber 51 from the load lock chambers 44a and 44b, ports 53 for attaching FOUP's (Front Open Unified Pods) 52a and 52b which store semiconductor wafers SW are disposed.

The transfer chamber 42 is held at a prescribed degree of vacuum by an evacuation mechanism or the like, and includes a transfer robot 42a for transferring a semiconductor wafer SW disposed at the central part thereof. The chambers 46a and 46b included in the transfer chamber 42 serves as a deposition chamber for depositing the insulation film 21 with a plasma CVD process.

The deposition device 41 is a device of a multi-chamber type, which includes a plurality of chambers 46a, 46b, 47a, 47b, 48a, and 48b. However, the number of the chambers included in the deposition device 41 can be variously changed. A device of the type which has only one chamber is also acceptable. However, at least one of the chambers 46a and 46b is required.

Whereas, in the deposition device 41, the chamber 46a and the chamber 46b are configured to be twin chambers having the same configuration; the chamber 47a and the chamber 47b are configured to be twin chambers having the same configuration; and the chamber 48a and the chamber 48b are configured to be twin chambers having the same configuration. This enables the device 41 to perform the same treatment on two semiconductor wafers at a time. As another embodiment, one of the chambers 46a and 46b, one of the chambers 47a and 47b, and one of the chambers 48a and 48b can also be omitted.

Figure 12:
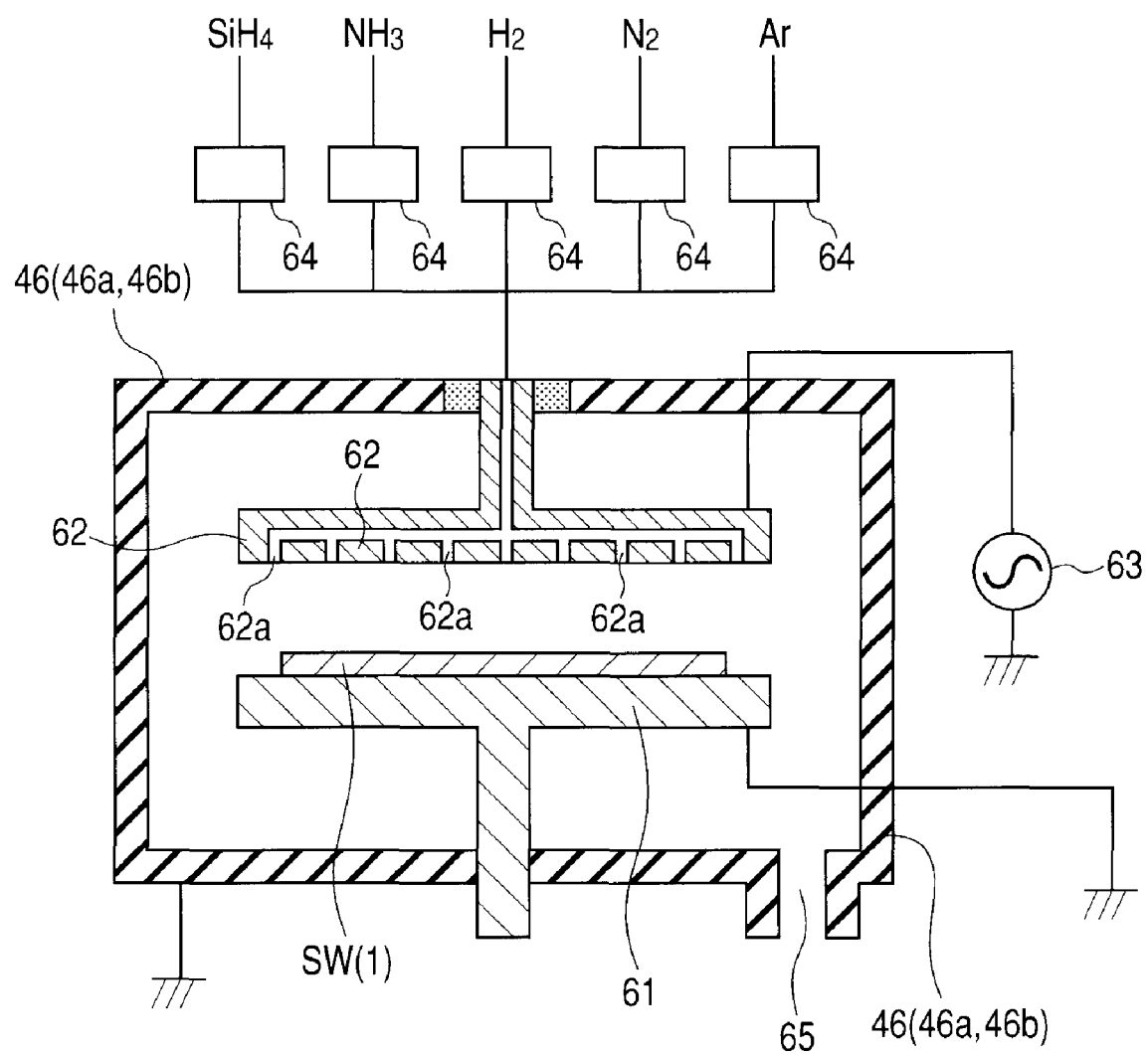
FIG. 12 is a schematic cross sectional view of a deposition chamber included in the deposition device of FIG. 11.

Then, the configuration of the chambers 46a and 46b of the deposition device 41 will be described. Incidentally, the chamber 46a and the chamber 46b have the same configuration, and hence, herein, the chambers 46a and 46b will be described as the chamber 46. FIG. 12 is a schematic cross sectional view of the deposition chamber 46 (i.e., chamber 46a or 46b) included in the deposition device 41.

The chamber 46 is a chamber (a treatment chamber or a reaction chamber) to be used for forming the insulation film 21 over the semiconductor wafer SW (i.e., the semiconductor substrate 1) with a CVD process, and is, for example, a chamber of a parallel plate type plasma CVD device.

As shown in FIG. 12, the chamber 46 is a treatment chamber capable of implementing vacuum tightness. In the chamber 46, mutually opposing lower electrode (substrate electrode) 61 and upper electrode (high frequency electrode) 62 are disposed. The lower electrode 61 can mount the semiconductor wafer SW (i.e., semiconductor substrate 1) thereover, and includes therein a heating mechanism such as a heater not shown. Whereas, the upper electrode 62 can be supplied (applied) with a high frequency electric power or a high frequency voltage by a high frequency power source 63 or the like disposed outside the chamber 46. On the other hand, the other end (the side not coupled to the upper electrode 62) of the high frequency power source 63, the lower electrode 61, and the inner wall of the chamber 46 are grounded.

Whereas, into the chamber 46, a desirable gas can be introduced at a desirable flow rate through gas inlet ports 62a disposed in the upper electrode 62. For example, the gas inlet ports 62a are coupled to the introduction paths of gases (herein, a $SiH_4$ gas, a $NH_3$ gas, a $H_2$ gas, a $N_2$ gas, and an Ar gas) to be required in steps S2 and S3 described later via mass flow controllers (gas flow rate control devices) 64. This allows a desirable kind of gas (a gas selected from $SiH_4$, $NH_3$, $H_2$, $N_2$, and Ar) to be introduced from the gas inlet port 62a into the chamber 46 at a desirable flow rate.

Whereas, the chamber 46 is coupled to a gas evacuation means (e.g., vacuum pump) not shown via a gas evacuation port 65. This allows the inside of the chamber 46 to be evacuated through the gas evacuation port 65 at a desirable evacuation rate. Further, a pressure control unit not shown controls the evacuation rate through the gas evacuation port 65, and the like, according to the pressure in the chamber 46 detected by a pressure sensor or the like, so that the inside of the chamber 46 can be kept under a desirable pressure.

Figure 13:
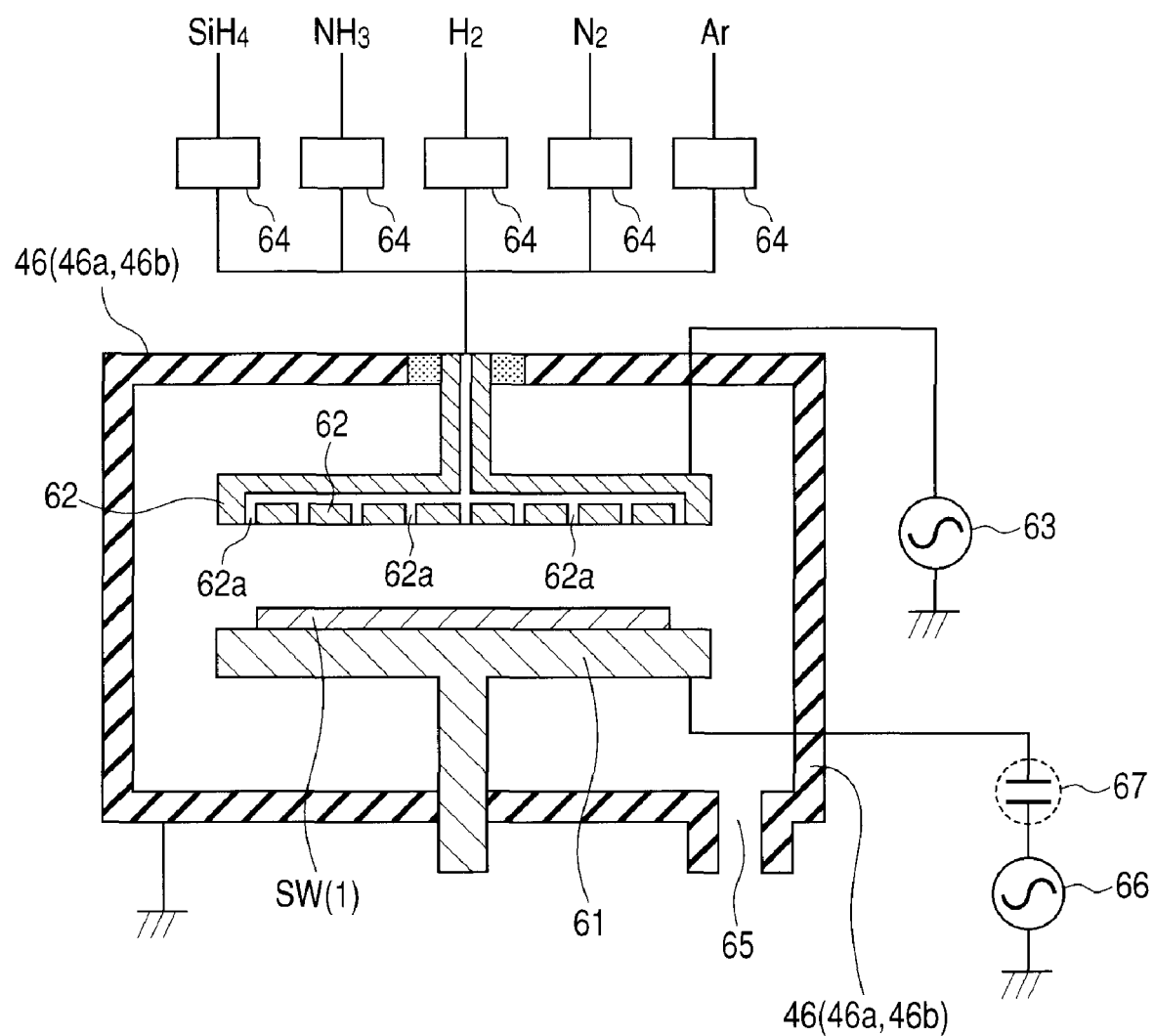
FIG. 13 is a schematic cross sectional view corresponding to a modified example of the deposition chamber described in FIG. 12.

Incidentally, the lower electrode 61 is desirably grounded from the viewpoint of a proper sputtering action. However, as shown in FIG. 13, a self bias circuit including a high frequency power source 66 for the lower electrode, a blocking capacitor 67, and the like may be coupled thereto to generate a weak direct current bias of 10 V or less, and desirably about 5 V or less.

3. Detailed description of inert gas plasma treatment (silicon nitride film CVD pretreatment) or the like on the silicide surface in the method for manufacturing a semiconductor integrated circuit device which is one embodiment of the present application (mainly FIGS. 14 to 18)

Figure 14:
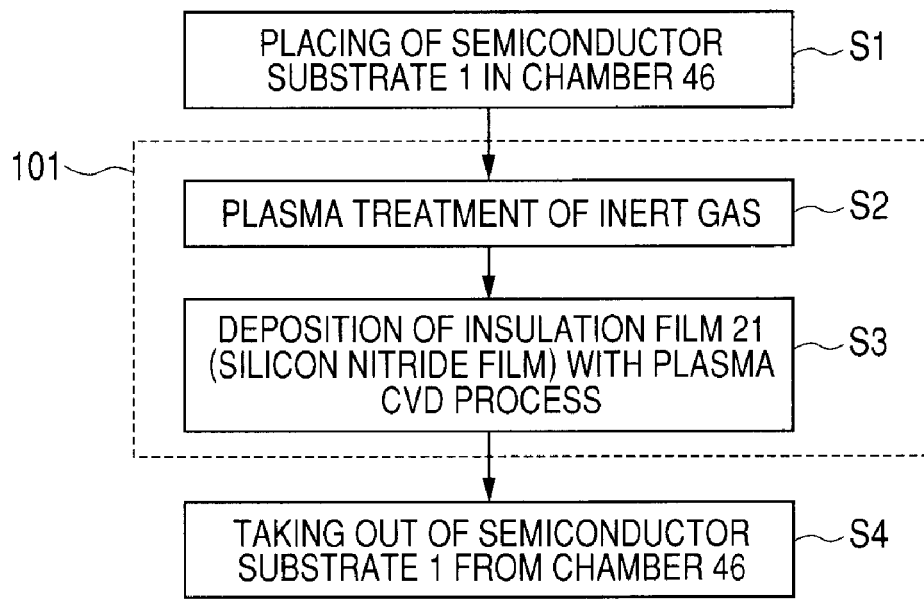
FIG. 14 is a manufacturing process flowchart showing a formation step of a silicon nitride film in the manufacturing step of the semiconductor integrated circuit device which is one embodiment of the present invention.

FIG. 14 is a manufacturing process flowchart showing the formation step of the insulation film 21. The formation step of the insulation film 21 is performed using the deposition device 41 in the following manner.

First, from a FOUP 52a or a FOUP 52b, the semiconductor wafer SW is taken out by the transfer robot 51a or the transfer robot 51b set in the wafer carry in/out chamber 51, and is transferred into the load lock chamber 44a or 44b. At this step, transfer of the semiconductor wafer SW between the transfer robots 51a and 51b is performed via a wafer transfer station 54. The semiconductor wafer SW corresponds to the semiconductor substrate 1. The FOUP 52a or 52b is an enclosed storage container for batch transfer of the semiconductor wafer SW, and generally stores the semiconductor wafers SW in batches of 25 wafers, 12 wafers, 6 wafers, or the like. The container outer walls of the FOUP's 52a and 52b are in an air-tight structure except for the fine air filter part, so that dust is almost completely excluded. Therefore, even when the wafer SW is transferred in a class 1000 atmosphere, the inside can be kept at a class 1 cleanliness. Docking with the deposition device 41 is carried out with cleanliness kept by attaching the doors of the FOUP's 52a and 52b to their respective ports 53, and drawing them into the inside of the wafer carry in/out chamber 51. Subsequently, the inside of the load lock chambers 44a and 44b are evacuated. Then, by the transfer robot 42a, the semiconductor wafers SW are vacuum transferred from the load lock chambers 44a and 44b via the transfer chamber 42 to the deposition chambers 46a and 46b. Thus, the semiconductor wafers SW, namely, the semiconductor substrates 1 are transferred into the chamber 46 (i.e., the chambers 46a and 46b), and are disposed in the chamber 46 (Step S1). In this step, each semiconductor substrate 1 (semiconductor wafer SW) is disposed over the lower electrode 61 in the chamber 46 with the main surface (top surface, front surface) on the side thereof on which the insulation film 21 is formed facing the upper electrode 62. The semiconductor substrate 1 (semiconductor wafer SW) disposed over the lower electrode 61 is heated by a heater included in the lower electrode 61. The semiconductor substrate 1 (semiconductor wafer SW) can also be disposed over the already heated lower electrode 61.

Then, the semiconductor substrate 1 (semiconductor wafer SW) disposed in the chamber 46 is treated with a non-bias plasma of a gas containing an inert gas as one of main components (which will be hereinafter referred to as "plasma of an inert gas" (Step S2). Over the semiconductor substrate 1, the metal silicide layer 13 is formed. For this reason, in Step S2, the surface of the metal silicide layer 13 formed over the semiconductor substrate 1 is treated with a plasma of an inert gas. With the plasma treatment of an inert gas of the step S2, the natural oxide film over the surface of the metal silicide layer 13 is removed by sputtering.

The plasma of an inert gas of the step S2 is preferably a plasma of argon gas (argon plasma), or a plasma of a mixed gas of an argon gas and a nitrogen gas. This can appropriately remove the natural oxide film over the surface of the metal silicide layer 13.

Namely, in the step S2, an inert gas (preferably an argon gas or a mixed gas of an argon gas and a nitrogen gas) is introduced through the gas inlet port 62a into the chamber 46. Thus, the evacuation rate through the gas evacuation port 65 is adjusted to control the pressure in the chamber 46 to a prescribed pressure. Thus, by the high frequency power source 63, the upper electrode 62 is supplied (applied) with a high frequency electric power (high frequency voltage). This generates a plasma by high frequency glow discharge between the lower electrode 61 and the upper electrode 62. Thus, the plasma of the inert gas introduced through the gas inlet port 62a is generated (formed) in the chamber 46 (between the lower electrode 61 and the upper electrode 62). By the plasma, the surface of the metal silicide layer 13 is treated (plasma treated), so that the natural oxide film over the surface of the metal silicide layer 13 is removed. The plasma treatment of an inert gas to be performed at the step S2 is preferably performed for about 10 to 60 seconds. This can remove the natural oxide film over the surface of the metal silicide layer 13, and can prevent the reduction of throughput due to an increase in manufacturing time.

Alternatively, at the step S2, other than an inert gas or the like, as a dilute gas, a carrier gas, or the like, a single gas or a plurality of gases selected from a nitrogen gas, and a helium (He) gas can also be introduced through the gas inlet port 62a into the chamber 46.

Further, the step S2 has a purpose of removing the natural oxide film over the surface of the metal silicide layer 13. Therefore, in the step S2, a silicon source gas (a gas containing Si as a constitutional element) such as a silane (SiH$_4$) gas is not introduced into the chamber 46.

After the plasma treatment of the inert gas in the step S2, over the semiconductor substrate 1 (i.e., semiconductor wafer SW), the insulation film 21 including silicon nitride is deposited by a plasma CVD process (step S3). After the plasma treatment of an inert gas of the step S2, it is important to perform the deposition step of the insulation film 21 of the step S3 without exposing the semiconductor substrate 1 (semiconductor wafer SW) into the air (in an oxygen-containing atmosphere). As a result, the insulation film 21 can be formed over the semiconductor substrate 1 including the surface of the metal silicide layer 13 without reformation of a natural oxide film over the surface of the metal silicide layer 13. To that end, the plasma treatment step of an inert gas of the step S2 and the deposition step of the insulation film 21 of the step S3 are preferably carried out continuously in the same chamber 46. Further, preferably, after performing the plasma treatment step of an inert gas of the step S2 in the chamber 46, the deposition step of the step S3 is started in the same chamber 46 without taking out the semiconductor substrate 1 from the chamber 46. However, between the time at which the plasma treatment of an inert gas of the step S2 has been performed and the time at which the insulation film 21 (silicon nitride film) is deposited in the step S3, an oxygen-containing gas is prevented from being introduced into the chamber 46. As a result, after the plasma treatment of an inert gas of the step S2, without exposing the semiconductor substrate 1 (semiconductor wafer SW) into an oxygen-containing atmosphere, the deposition step of the insulation film 21 of the step S3 can be performed. This can prevent reoxidation of the surface of the metal silicide layer 13.

Namely, after the step S2, the high frequency electric power (high frequency voltage) to be supplied (applied) to the upper electrode 62 is once stopped. Then, at the step S3, reaction gases (a source gas, a raw material gas, and a gas for deposition), such as a silane (SiH$_4$) gas, an ammonia (NH$_3$) gas, and a nitrogen (N$_2$) gas are introduced through the gas inlet ports 62a into the chamber 46. Thus, the evacuation rate through the gas evacuation ports 65 is adjusted to control the pressure in the chamber 46 to a prescribed pressure. By the high frequency power source 63, the upper electrode 62 is supplied (applied) with a high frequency electric power (high frequency voltage). This generates a plasma by high frequency glow discharge between the lower electrode 61 and the upper electrode 62. The reaction gas is decomposed, so that over the semiconductor substrate 1 (semiconductor wafer SW) disposed over the lower electrode 61, the insulation film 21 including a silicon nitride film (plasma silicon nitride film) is deposited. Below, the silicon nitride film formed by a plasma CVD process may be referred to as a plasma silicon nitride film.

In the step S3, through the gas inlet ports 62a into the chamber 46, as a silicon source gas for silicon nitride, a first gas containing a silicon (Si) element as a constitutional element, preferably, a silane type gas such as a silane (SiH$_4$) gas, and as a nitrogen source gas for silicon nitride, a second gas containing a nitrogen element as a constitutional element, preferably, an ammonia (NH$_3$) gas are introduced. A plasma of these gases is generated to deposit the insulation film 21. In the step S3, other than these, as a dilute gas, a carrier gas, or the like, an inert gas, for example, a single gas or a plurality of gases selected from a nitrogen (N$_2$) gas, an argon (Ar) gas, and a helium (He) gas can also be introduced through the gas inlet ports 62a into the chamber 46.

In this embodiment, before the deposition step of the insulation film 21 (silicon nitride film) of the step S3, In an In-situ treatment, the natural oxide film over the surface of the metal silicide layer 13 is removed and purified by the plasma treatment of an inert gas of the step S2. Accordingly, the insulation film 21 is deposited over the metal silicide layer 13 from which the surface oxide film has been removed.

After the deposition step of the insulation film 21 of the step S3, the semiconductor substrate 1 (semiconductor wafer SW) is taken out from the chamber 46 (step S4), and is fed to the subsequent step (deposition step of the insulation film 22). For example, by the transfer robot 42a, the semiconductor wafer SW is vacuum transferred from the deposition chambers 46a or 46b (i.e., chamber 46) via the transfer chamber 42 to the load lock chamber 44a or 44b. Then, by the transfer robot 51a or 51b, the semiconductor wafer SW is returned from the load lock chamber 44a or 44b via the wafer carry in/out chamber 51 to the original FOUP 52a or FOUP 52b. At this step, transfer of the semiconductor wafer SW between the transfer robots 51a and 51b is carried out via the wafer transfer station 54.

Thus, in this embodiment, in the step S2, the surface of the metal silicide layer 13 is treated with a plasma of an inert gas. Then, without exposing the semiconductor substrate 1 into the air, in the step S3, the insulation film 21 (silicon nitride film) is formed over the semiconductor substrate 1 including over the metal silicide layer 13 by a plasma CVD process. More preferably, in the step S2, the surface of the metal silicide layer 13 is treated with a plasma of an inert gas. Then, without exposing the semiconductor substrate 1 into an oxygen-containing atmosphere, in the step S3, the insulation film 21 is formed over the semiconductor substrate 1 including over the metal silicide layer 13. By the plasma treatment of an inert gas of the step S2, the natural oxide film over the surface of the metal silicide layer 13 is removed. Then, without exposing the semiconductor substrate 1 into the air (in an oxygen-containing atmosphere), in the step S3, the insulation film 21 is deposited. Therefore, an oxide film is not formed at the interface between the formed insulation film 21 and the metal silicide layer 13. For this reason, eve when various heating steps (e.g., steps involving heating of the semiconductor substrate 1 as with various insulation film and conductor film deposition steps) after deposition of the insulation film 21 are carried out, the metal silicide layer 13 can be prevented from partially and abnormally growing due to oxygen of the oxide film at the interface between the metal silicide layer 13 and the insulation film 21. This can prevent an increase in resistance of the metal silicide layer 13 due to abnormal growth. Further, this can prevent the following: the metal silicide layer 13 formed over the source/drain regions abnormally grows at the channel part, resulting in an increase in the leakage current between source/drain of the field-effect transistor. Therefore, the performances of the semiconductor integrated circuit device can be improved. Furthermore, the reliability of the semiconductor integrated circuit device can be improved.

The insulation film 21 functions as an etching stop film for etching the insulation film 22 in order to form contact holes 23, and hence it can also be regarded as an insulation film for SAC (Self Align Contact). When the insulation film 21 formed over the main surface of the semiconductor substrate 1 is formed as a film for generating a tensile stress in the semiconductor substrate 1, the n channel type MISFET Qn is improved in mobility, resulting in an increase in driving current. Therefore, the switching characteristics are improved. Whereas, when the insulation film 21 formed over the main surface of the semiconductor substrate 1 is formed as a film for generating a compression stress in the semiconductor substrate 1, the p channel type MISFET Qp is improved in mobility, resulting in an increase in driving current. Therefore, the switching characteristics are improved. Thus, the insulation film 21 formed over the main surface of the semiconductor substrate 1 may be formed as a film for generating a tensile strength in the semiconductor substrate 1, or may be formed as a film for generating a compression stress therein. Either case is selected, if required. Herein, as one example, a description will be given primarily to the case of the film for generating a tensile strength in the semiconductor substrate 1.

Further, as described in connection with FIGS. 4 through 7, the metal silicide layer 13 preferably has a low resistivity. Therefore, the metal silicide layer 13 is required to be in the lowest resistivity phase of the $M_2Si$ (dimetal silicide) phase, the MSi (metal monosilicide) phase, and the $MSi_2$ (metal disilicide) phase. However, according to the kind of the metal element forming the metal silicide layer 13, there may be the case where the MSi phase has the lowest resistivity, or the case where the $MSi_2$ phase has the lowest resistivity. On the other hand, when a natural oxide film is formed (left) at the interface between the metal silicide layer 13 and the insulation film 21, in various heating steps after deposition of the insulation film 21, the metal silicide layer 13 partially abnormally grows due to oxygen in the natural oxide film. However, the abnormal growth becomes particularly remarkable when the metal silicide layer 13 is in the MSi phase. This is due to the following: the $MSi_2$ phase is a phase which is less likely to more react with Si (silicon), but, in contrast, the $M_2Si$ phase and the MSi phase are phases which tend to further react with Si(silicon). When the metal silicide layer 13 is in the MSi phase, oxygen (O) in the natural oxide film diffuses, so that defects due to oxygen increase. Through the formed defects, the metal element in the MSi phase metal silicide layer 13 diffuses. Thus, reaction: $MSi+Si \rightarrow MSi_2$ occurs, so that portions of $MSi_2$ abnormally grow.

For this reason, when the MSi phase has a lower resistivity than those of the $M_2Si$ phase and the $MSi_2$ phase, in order to apply the MSi phase, in which the $MSi_2$ portions tend to abnormally grow, to the metal silicide layer 13, it is very important to prevent the abnormal growth of the metal silicide layer 13 due to the natural oxide film at the interface between the metal silicide layer 13 and the insulation film 21.

In this embodiment, in the step S2, the natural oxide film is removed by sputtering. Then, in the step S3, the insulation film 21 is formed. Therefore, an oxide film is not formed at the interface between the metal silicide layer 13 and the insulation film 21. Thus, in various heating steps after deposition of the insulation film 21, the metal silicide layer 13 can be prevented from partially abnormally growing. For this reason, even when the MSi phase, in which the $MSi_2$ portions tend to abnormally grow, is applied to the metal silicide layer 13, abnormal growth of the $MSi_2$ portions can be prevented. Therefore, this embodiment produces large effects when, as the first condition, applied to the case where the metal silicide layer 13 is formed with a metal silicide such that the MSi (metal monosilicide) phase is lower in resistivity than the $MSi_2$ (metal disilicide) phase and the $M_2Si$ (dimetal silicide) phase. Further, in this case, until completion of manufacturing of the semiconductor integrated circuit device (e.g., the stage at which the semiconductor substrate 1 has been divided into individual pieces by dicing or the like to form semiconductor chips), the metal silicide layer 13 is still held in the MSi phase. This is due to the following. In the manufactured semiconductor integrated circuit device, the metal silicide layer 13 is allowed to assume the MSi phase lower in resistivity than the $MSi_2$ phase and the $M_2Si$ phase. As a result, the metal silicide layer 13 is low in resistance, which can reduce the contact resistance, and diffusion resistances of source/ drain. This can improve the performances of the semiconductor integrated circuit device including MISFET's formed therein.

Further, in this embodiment, even when the MSi phase metal silicide layer 13 is formed, abnormal growth of $MSi_2$ can be prevented. Therefore, this embodiment produces large effects when applied to the case where the metal silicide layer 13 is formed by silicide allowing the presence of the $MSi_2$ (metal disilicide) phase therein.

Further, this embodiment can prevent the following: in various heating steps after deposition of the insulation film 21, due to the natural oxide film at the interface between the metal silicide layer 13 and the insulation film 21, the metal element M of the metal silicide layer 13 diffuses, so that the $MSi_2$ portions abnormally grow. Therefore, this embodiment produces large effects when applied to the case where not Si (silicon) but a metal element M is the diffusion species.

In consideration of these, this embodiment produces large effects when applied to the case where the metal film 11 is a Ni (nickel) film or a Ni (nickel) alloy film. Namely, this embodiment produces large effects when applied to the case where the metal silicide layer 13 is a silicide layer of nickel (nickel silicide layer) or a silicide layer of nickel alloy (nickel alloy silicide layer). The Ni (nickel) alloy films usable for the metal film 11 include a Ni—Pt (nickel-platinum) alloy film (alloy with a platinum group element), a Ni—V (nickel-vanadium) alloy film, a Ni—Pd (nickel-palladium) alloy film (alloy with a platinum group element), a Ni—Yb (nickel-ytterbium) alloy film (alloy with a rare earth element), or a Ni—Er (nickel-erbium) alloy film (alloy with a rare earth element). When the metal film 11 is a Ni film, a Ni—Pt alloy film, a Ni—V alloy film, a Ni—Pd alloy film, a Ni—Yb alloy film, or a Ni—Er alloy film, not Si (silicon) but a metal element M is the diffusion species. Thus, the $MSi_2$ phase exists, and the MSi phase is lower in resistivity than the $MSi_2$ phase and the $M_2Si$ phase. However, the problem of abnormal growth of $MSi_2$ from the metal silicide layer 13 to the channel part, and the problem of the increase in variations of the resistance due to the formation of the $MSi_2$ portions in the metal silicide layer occur in any of the cases where the metal film 11 is a Ni film, a Ni—Pt alloy film, a Ni—V alloy film, a Ni—Pd alloy film, a Ni—Yb alloy film, or a Ni—Er alloy film. The problems most remarkably occur especially when the metal film 11 is Ni (nickel) film. For this reason, this embodiment is most effective when applied to the case where the metal film 11 is a Ni (nickel) film.

Further, in this embodiment, a description was given to the case where over the semiconductor region for source or drain (7b or 8b), and over the gate electrodes (6a and 6b), the metal silicide layer 13 is formed. However, as another form, the following configuration is also acceptable: over the gate electrodes 6a and 6b, the metal silicide layer 13 is not formed, but over the semiconductor region for source or drain (herein, an $n^+$ type semiconductor region 7b or a $p^+$ type semiconductor region 8b), the metal silicide layer 13 is formed.

Further, in this embodiment, as the optimum form, a description was given to the case where over the semiconductor region for source or drain (herein, an $n^+$ type semiconductor region 7b or a $p^+$ type semiconductor region 8b) formed in the semiconductor substrate 1, the metal silicide layer 13 is formed. However, as another form, over other semiconductor regions than those for source or drain formed in the semiconductor substrate 1, the metal silicide layer 13 can also be formed. Also in that case, by using such an insulation film 21 formation method as in this embodiment, abnormal growth of the metal silicide layer 13 can be prevented, which can reduce variations in resistance of the metal silicide layer 13. However, as in this embodiment, over the semiconductor region for source or drain (the n⁺ type semiconductor region 7b or the p⁺ type semiconductor region 8b) formed in the semiconductor substrate 1, the metal silicide layer 13 is formed. This case produces, in addition to the effect of reducing variations in resistance of the metal silicide layer 13, the effect of preventing the metal silicide layer 13 from abnormally growing at the channel part, and thereby preventing the increase in leakage current between source/drain of the field-effect transistor. Thus, the effects are very large.

Figure 6:
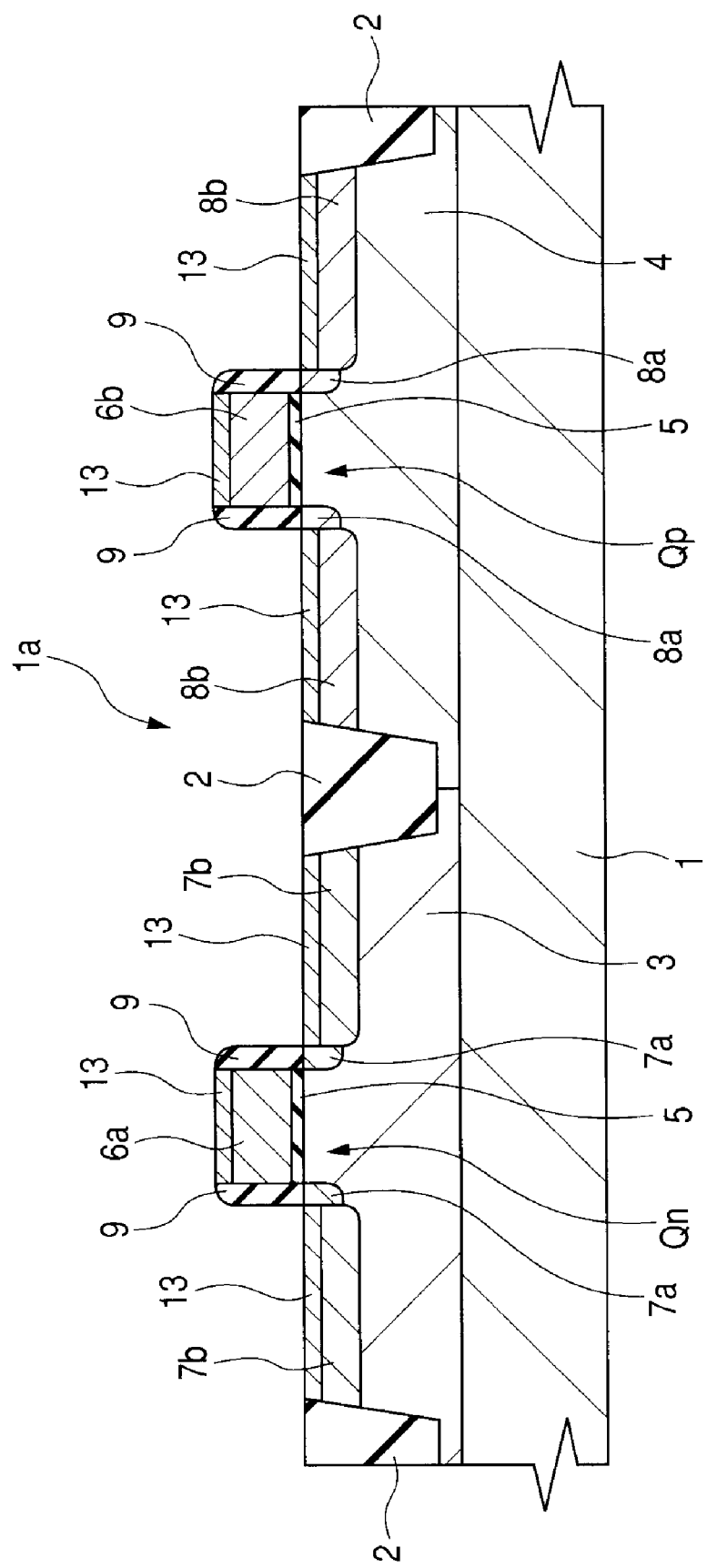
FIG. 6 is a cross sectional view of an essential part during a manufacturing step of the semiconductor integrated circuit device following FIG. 5.
Figure 15:
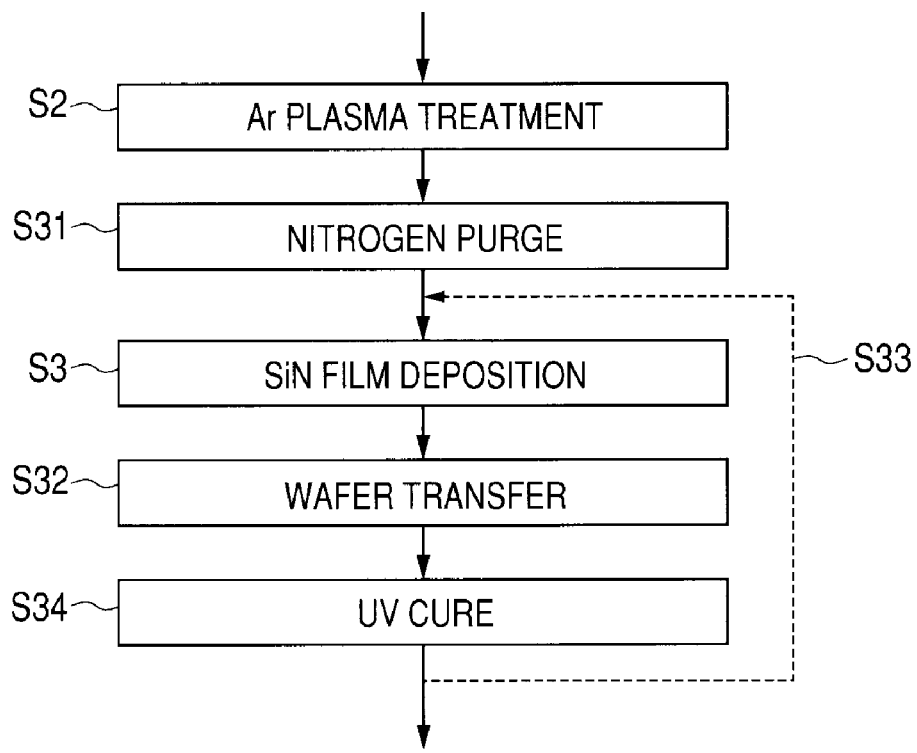
FIG. 15 is a detailed block flowchart regarding the plasma treatment/deposition process of FIG. 14 (the case where a tensile stress is applied to an N channel MISFET)

Then, the details of the plasma treatment/deposition process 101 of FIG. 14 will be described by reference to FIG. 15 (for the device cross section flow, see FIG. 6 or FIG. 7, and for the treatment device, see FIGS. 11 to 13). As shown in FIG. 15, first, over the wafer stage 61 (grounded lower electrode) of the gas phase treatment chamber 46 of the wafer treatment device 41, the wafer 1 is mounted with the device surface 1a (first main surface) facing upward. In this state, the plasma treatment S2 by an inert gas is carried out. Preferable one example of various conditions in this step are, for example, the treatment time: 30 seconds, the stage temperature: 400 degrees centigrade, the chamber inner pressure: 1100 pascals, the nitrogen gas flow rate: 3000 sccm, and the argon gas (inert gas) flow rate: 3000 sccm. Examples of the gas phase treatment device 41 may include a parallel plate type (capacitive coupling type) insulation film deposition device (herein, mainly, a silicon nitride film CVD device) from Applied Materials Co. For plasma generation (for argon plasma generation), with the lower electrode 61 grounded, a high frequency electric power of 100 watts (13.56 MHz) was supplied to the upper electrode 62.

Then, with wafer 1 held as it is (i.e., mounted on the wafer stage 61 of the gas phase treatment chamber 46 with the device surface 1a facing upward, the same applies hereinafter), the nitrogen purge S31 for gas replacement is carried out. Preferable one example of various conditions in this step are, for example, the treatment time: 5 seconds, the stage temperature: 400 degrees centigrade, the chamber inner pressure: 1100 pascals, the nitrogen gas flow rate: 3000 sccm, the lower electrode 61: grounded, and the high frequency electric power to the upper electrode 62: OFF state.

Then, with the wafer 1 held as it is, deposition of the silicon nitride film 21 (etching stop film) is carried out by plasma CVD. Preferable one example of various conditions in this step are, for example, the treatment time: 15 seconds, the stage temperature: 400 degrees centigrade, the chamber inner pressure: 1100 pascals, the monosilane gas flow rate: 60 sccm, the ammonia gas flow rate: 900 sccm, the nitrogen gas flow rate: 1000 sccm, the lower electrode 61: grounded, and the high frequency electric power of 100 watts (13.56 MHz) to the upper electrode 62: ON state.

Then, the wafer 1 is transferred to, for example, another chamber (another chamber than the chambers for the argon plasma treatment and silicon nitride film formation) of the multi-chamber type wafer treatment device 41 for the UV cure treatment S34 for imparting a tensile stress to improve the characteristics of the N channel MISFET to the silicon nitride film 21. Then, the wafer 1 is mounted over the wafer stage in the same state as in the previous argon plasma treatment, or the like. In this case, above the wafer, an ultraviolet lamp is disposed. When the lamp is turned on, the UV cure treatment S34 is carried out. Preferable one example of various conditions in this step are, for example, the treatment time: 180 seconds, the stage temperature: 443 degrees centigrade, the chamber inner pressure: 800 pascals, the nitrogen gas flow rate: 16000 sccm, the lower electrode 61: grounded, and the ultraviolet lamp power: 95%.

Incidentally, there was shown the case where the steps from the silicon nitride film deposition S3 to the UV cure treatment S34 are each performed only one time for shortening of the treatment time. However, several-time repetition thereof (repeating treatment S33) can apply a necessary stress with more reliability.

4. Detailed description of the inert gas plasma treatment (tungsten plug embedding pretreatment) and the like on the silicide surface in the method for manufacturing a semiconductor integrated circuit device which is one embodiment of the present application (mainly FIG. 19)

The low bias plasma treatment (low bias plasma treatment before silicon nitride deposition) on the top side of the silicide film 13 under an inert gas atmosphere described in details in Section 3 is also effectively applicable to before the titanium deposition in the tungsten plug step (low bias plasma treatment before titanium deposition) of FIG. 9. These low bias plasma treatments may be both carried out as in this embodiment. However, if required, only any one thereof may be carried out.

Below, by reference to FIG. 19 (for the device cross section flow, see FIG. 8 or FIG. 9, and for the treatment device, see FIGS. 11 to 13), a description will be given to the detailed process 101 of the low bias plasma treatment before titanium deposition and titanium CVD. As the gas phase treatment device, the previously described multi-chamber type wafer treatment device 41 or a similar device can be used. Herein, a description will be given by taking the multi-chamber type wafer treatment device 41 as an example.

As previously described, in FIG. 9, at the bottom of each contact hole 23, the insulation film 21 is completely removed. Thus, the contact hole 23 penetrates through the insulation films 22 and 21. Accordingly, at the bottom of each contact hole 23, portions of the main surface of the semiconductor substrate 1, for example, portions of the metal silicide layer 13 over the surfaces of the n⁺ type semiconductor region 7b and the p⁺ type semiconductor region 8b, portions of the metal silicide layer 13 over the surfaces of the gate electrodes 6a and 6b, and the like are exposed.

Figure 19:
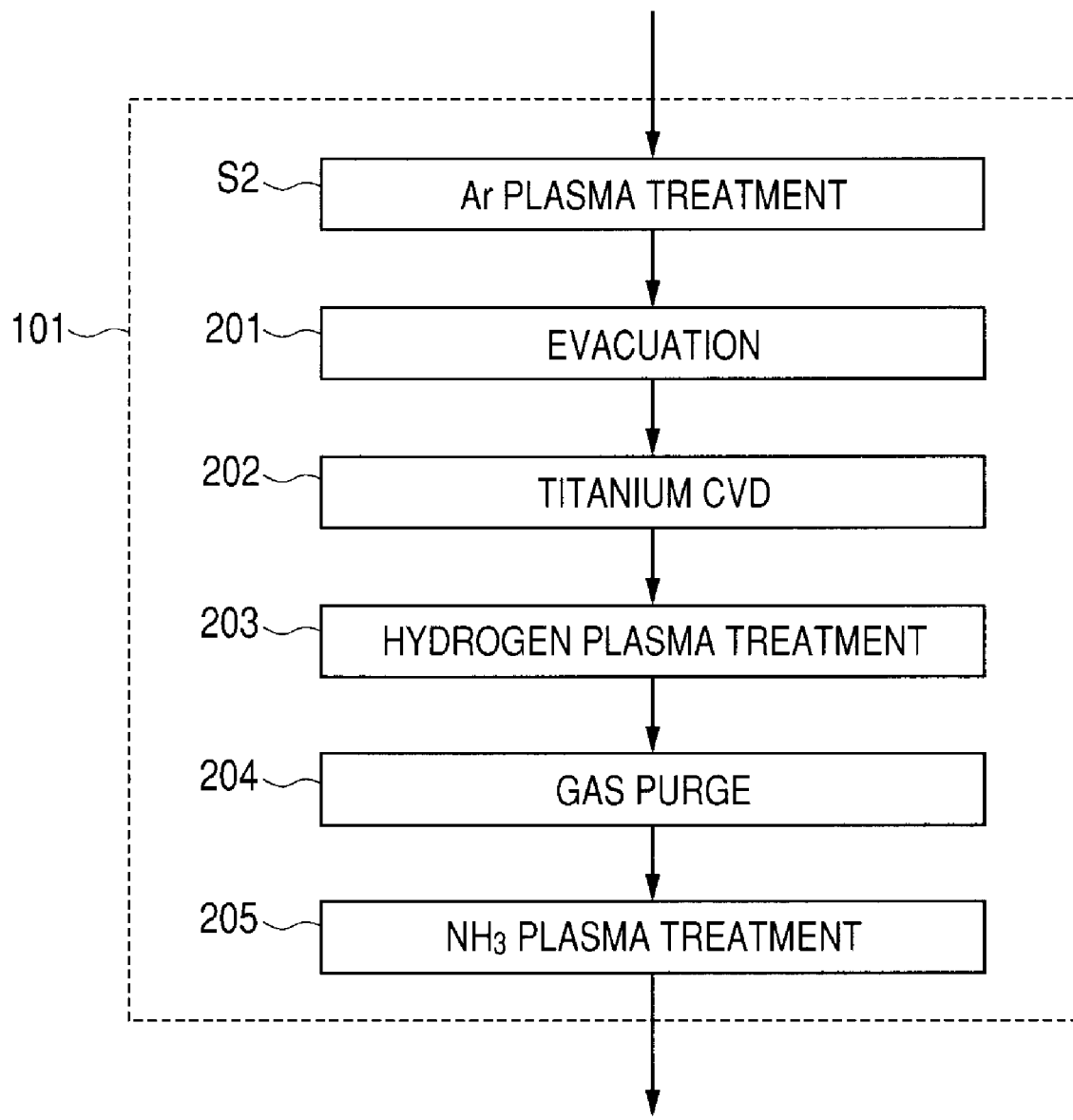
FIG. 19 is a manufacturing process flowchart showing the details of a barrier metal formation step or the like before tungsten plug embedding in the manufacturing step of a semiconductor integrated circuit device which is one embodiment of the present invention.

Then, as shown in FIG. 19, in the same manner as described in Section 3, over the wafer stage 61 (grounded lower electrode) of the titanium CVD chamber 46 of the multi-chamber type wafer treatment device 41, the wafer 1 is mounted with the device surface 1a (first main surface) facing upward. In that state, the plasma treatment S2 by an inert gas is carried out. Preferable one example of various conditions in this step are, for example, the treatment time: 15 seconds, the stage temperature: 450 degrees centigrade, the chamber inner pressure: 650 pascals, the argon gas (inert gas) flow rate: 800 sccm, the lower electrode 61: grounded, and the high frequency electric power of 100 watts (450 MHz) to the upper electrode 62: ON state.

Then, with the wafer 1 held as it is, evacuation 201 for gas replacement is carried out. The required time is about 15 seconds.

Then, with the wafer 1 held as it is, the titanium CVD treatment 202 is carried out. As a result, over the inner surface of the contact hole 23 and the thick insulation film 22 (silicon oxide film type premetal interlayer insulation film), a metal film (adhesion promoting layer) with a thickness of, for example, about 5 nm containing titanium as a main component is formed. Preferable one example of various conditions in this step are, for example, the treatment time: 25 seconds, the stage temperature: 450 degrees centigrade, the chamber inner pressure: 650 pascals, the argon gas (inert gas) flow rate: 800 sccm, the hydrogen gas (reducing gas) flow rate: 4000 sccm, the TiCl₄ (metal source gas) flow rate: 7 sccm, the lower electrode 61: grounded, and the high frequency electric power of 800 watts (450 MHz) to the upper electrode 62: ON state.

Then, with the wafer 1 held as it is, $TiCl_4$ (metal source gas) is stopped (with other conditions unchanged), so that the hydrogen plasma treatment 203 for removing the residual chlorine, and the like is carried out.

Then, with the wafer 1 held as it is, the application of a high frequency electric power is turned off (with other conditions unchanged), so that the gas purge 204 is carried out. The required time is about 15 seconds.

Then, with the wafer 1 held as it is, the application of a high frequency electric power is turned on while supplying an ammonia gas (with other conditions unchanged), so that the ammonia plasma treatment 205 for changing the surface portion of the titanium film into a nitrogen-rich TiN film is carried out. Preferable one example of various conditions in this step are, for example, the treatment time: 25 seconds, the stage temperature: 450 degrees centigrade, the chamber inner pressure: 650 pascals, the argon gas (inert gas) flow rate: 800 sccm, the hydrogen gas (reducing gas) flow rate: 4000 sccm, the ammonia gas flow rate: 500 sccm, the lower electrode 61: grounded, and the high frequency electric power of 800 watts (450 kMHz) to the upper electrode 62: ON state. The titanium film and the TiN film form the barrier conductor film 24a. The optimum ratio of thicknesses of the titanium film and the TiN film is considered to be about 2:3.

Thereafter, the wafer 1 is transferred to the tungsten thermal CVD step (FIG. 9) for filling the contact hole 23 with tungsten (the tungsten CVD step is generally carried out in another chamber of the same device or another device).

5. Consideration on the low bias plasma treatment and the like before silicon nitride deposition (mainly FIGS. 16 to 18)

A description will be give to the reason why the low bias plasma treatment under an argon plasma atmosphere is preferable in the low bias plasma treatment before silicon nitride deposition and the low bias plasma treatment before titanium deposition described up to this point.

Figure 16:
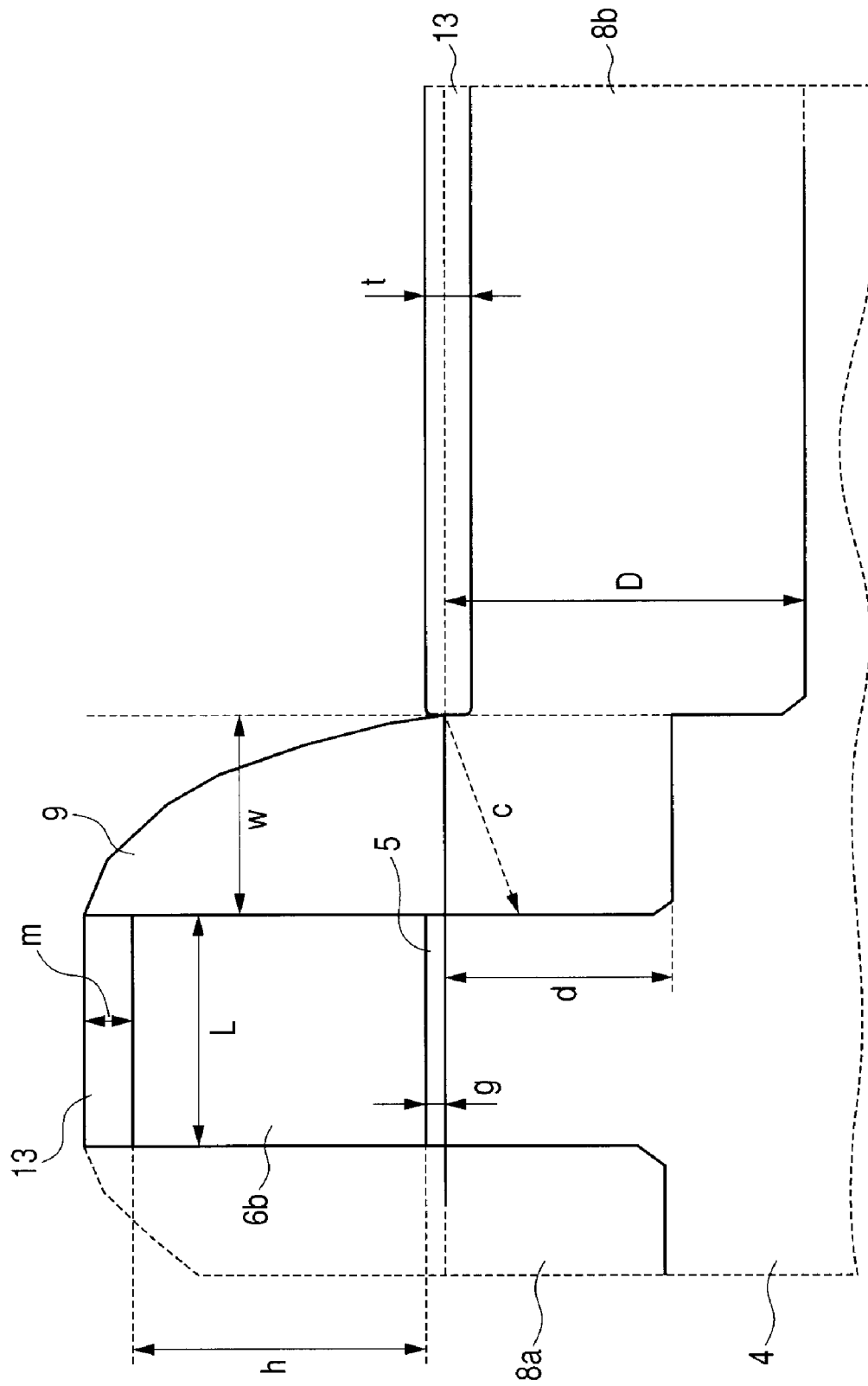
FIG. 16 is a device cross sectional view (corresponding to a P type MISFET) for illustrating the relationship between the main dimensions and an impurity leakage path of a device manufactured by a method for manufacturing of a semiconductor integrated circuit device which is one embodiment of the present invention.

First, by taking a 45-nm technology node p channel type MISFET (Qp of FIG. 10) as an example, the relationship between the structure/dimensions of the device and the characteristics thereof will be described. Incidentally, the dimensions of respective parts are also roughly the same for the corresponding n channel type MISFET (Qn). FIG. 16 is an enlarged schematic cross-sectional view corresponding to the p channel type MISFET(Qp) (for convenience of showing, the length-to-width dimension ratio is not the same). As shown in FIG. 16, the p channel type MISFET(Qp) is formed in the region in the vicinity of the surface of the n type well 4. In the surface of the n type well 4, the p⁻ type semiconductor region (P type extension region) 8a and the p⁺ type semiconductor region (P type high-concentration source/drain regions) 8b are formed. The depth d of the p type extension region 8a is, for example, about 40 nm. The depth D of the p type high-concentration source/drain regions 8b is, for example, about 80 nm. Over the surface of the P type high-concentration source/drain region 8b, the nickel silicide film 13 is formed. The thickness t thereof is, for example, about 20 nm. Over the channel region, there is the gate insulation film 5. The thickness g thereof is, for example, about 2.5 nm. Thereover, there is the gate electrode 6b (polysilicon electrode). The thickness h thereof is, for example, about 80 nm. The width L (gate length) is, for example, about 40 nm. Further, thereover, the nickel silicide film 13 over the gate electrode 6b is formed. The thickness m thereof is, for example, about 20 nm. On the opposite sides of the gate electrode 6b, there is the sidewall spacer 9. The width w of the maximum part thereof (roughly equal to the projection length of the P type extension region 8a) is, for example, about 33 nm. Therefore, the relationship of w<d (with the 65-nm technology node, the relationship of w>d generally holds) holds.

Therefore, when the sputtering action is strong in the low bias plasma treatment, and the like before the silicon nitride deposition, the sidewall spacer 9 is excessively abraded. As a result, the junction leakage path c to the channel part is shortened, which may deteriorate the device characteristics. Therefore, it is preferable that the self bias voltage of the lower electrode is set at substantially zero (equivalent to grounding of the lower electrode), or is controlled to about 10 V or less (desirably, 5 V or less). This is because the maximum thickness of the natural oxide film (silicon oxide film) formed over the surface of the nickel silicide film can be considered to be about 3 nm (about 1 nm in average thickness).

Figure 17:
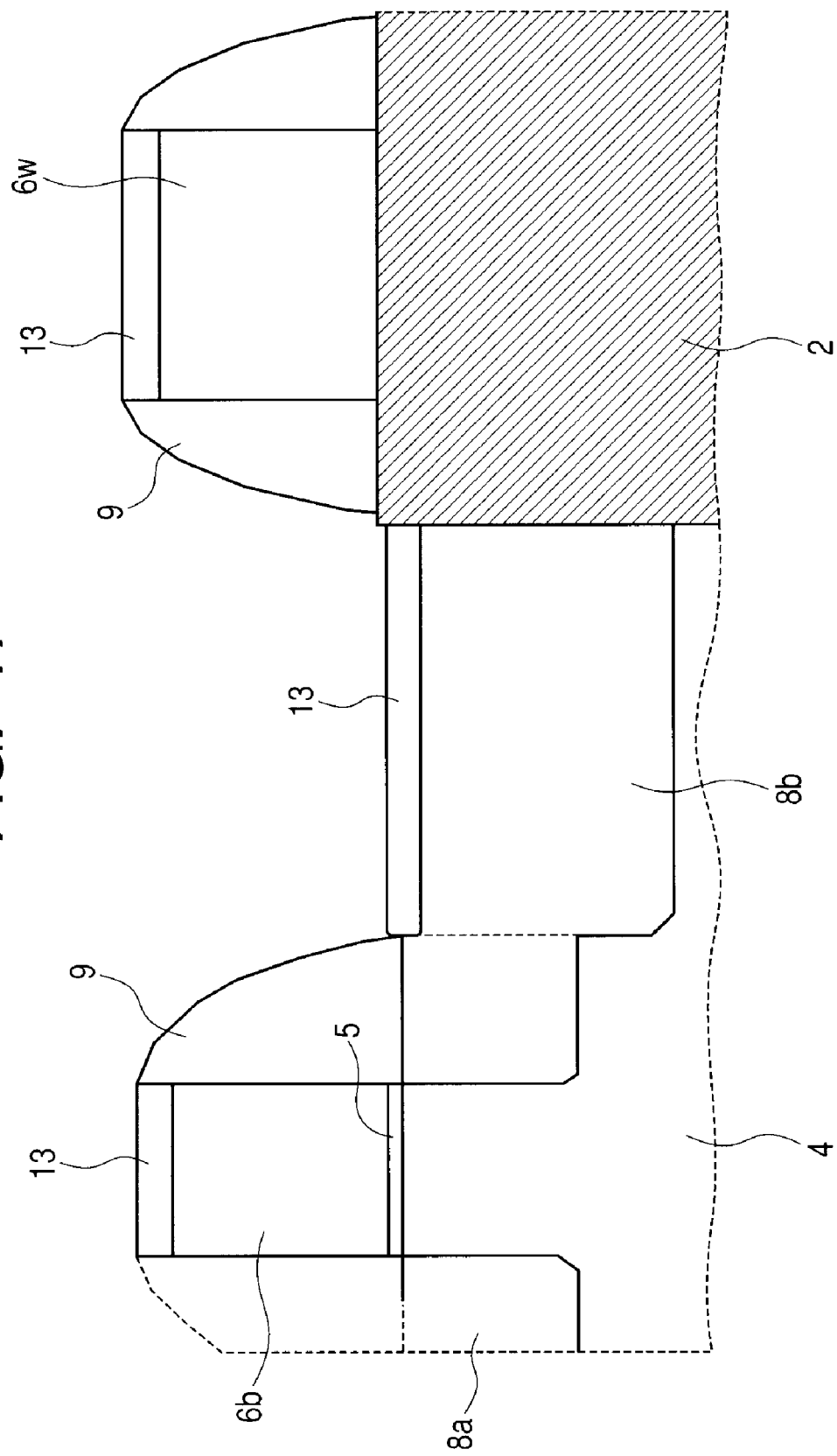
FIG. 17 is a device cross sectional view (corresponding to a P type MISFET) of a shared contact part of a device manufactured by the method for manufacturing of a semiconductor integrated circuit device which is one embodiment of the present invention.

FIG. 17 is an enlarged schematic cross-sectional view corresponding to the shared contact portion of FIG. 16. Over the field insulation film 2 for STI (Shallow Trench Isolation), there are polysilicon wiring 6w, and the like. Incidentally, the shared contact structure herein referred to is a structure in which the polysilicon wiring 6w and the semiconductor region 8b are coupled through one coupling hole. In the shared contact structure, in relation to overetching of the silicon nitride film 21 (etching stop film), the lower end width w of the sidewall insulation film is often relatively small. Thus, there is a particularly high necessity of inhibiting the sputtering action in the low bias plasma treatment or the like before silicon nitride deposition.

Figure 18:
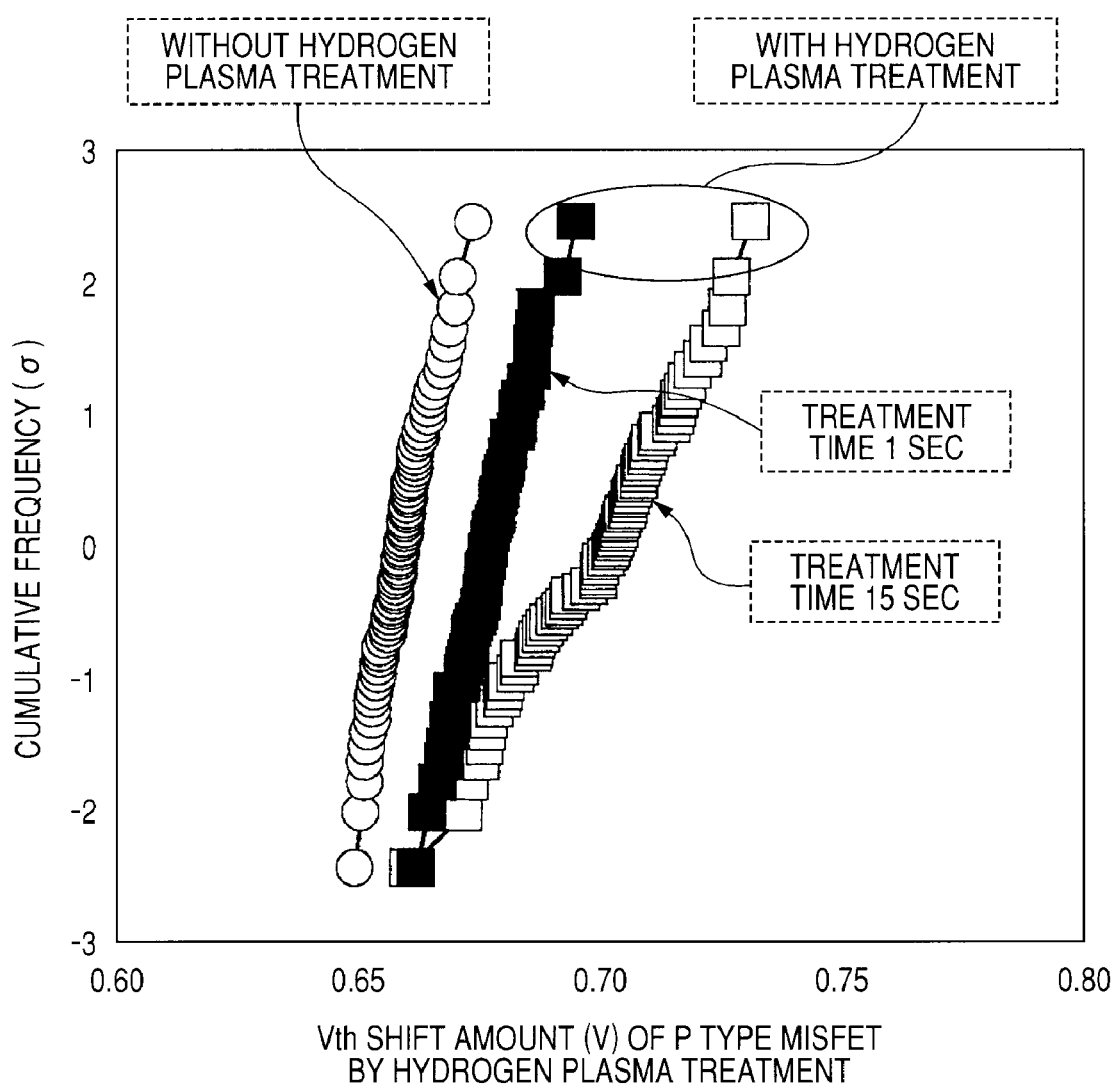
FIG. 18 is a plot chart showing fluctuations in characteristics of the P type MISFET when a hydrogen-containing plasma treatment has been performed in order to remove a natural oxide film over a metal silicide film.

FIG. 18 shows the case where in order to evaluate the effect of hydrogen in the atmosphere in the low bias plasma treatment before silicon nitride deposition, a hydrogen plasma treatment is additionally carried out subsequently. As indicated from this example, with an increase in hydrogen plasma treatment time, the Vth shift amount of the p channel type MISFET rapidly increases. This is due to the deterioration of the gate insulation film mainly caused by hydrogen. Therefore, preferably, the atmosphere of the low bias plasma treatment before silicon nitride deposition contains argon as one of main components, and substantially does not contain a hydrogen gas or a hydrogen-containing gas (a hydrogen-containing gas such as an ammonia gas). However, trace-amount addition for other purposes is not excluded. Incidentally, as a dilute gas (for pressure adjustment or the like), a non-oxidizing gas such as nitrogen is preferably contained as another main component. However, a dilute gas is not essential.

Incidentally, in the low bias plasma treatment before titanium deposition, addition of a large amount of a non-oxidizing gas such as nitrogen may cause an increase in resistance due to nitriding of the nickel silicide surface, and is not as preferable as in the low bias plasma treatment before silicon nitride deposition. However, under circumstances in which such a problem is not fatal, the addition is still effective from the viewpoints of stabilization of plasma and the like.

6. Summary

Up to this point, the invention done by the present inventors was described specifically by way of the embodiments, which should not be construed as limiting the present invention. It is naturally understood that various changes may be made within the scope not departing from the gist.

For example, in the embodiments, specific description was mainly given to the capacitive coupling type CVD device. However, the present invention is not limited thereto. It is naturally understood that the present invention is also applicable to the one using an inductive coupling type device, a helicon wave type device, a microwave excitation type device, or the like. Further, in the embodiments, a description was given to the case where the metal silicide layer 13 is the silicide layer containing nickel as a main component. However, it is naturally understood that the present invention is also applicable to the case of the silicide layer containing cobalt or the like as a main component.

What is claimed is:

1. A method for manufacturing a semiconductor integrated circuit device, comprising the steps of:
   (a) forming a MISFET in a region in the vicinity of a first main surface of a semiconductor wafer,
   the MISFET having:
      (x1) source/drain regions disposed in a surface region of the first main surface;
      (x2) a gate insulation film disposed over the first main surface;
      (x3) a gate electrode disposed over the gate insulation film; and
      (x4) a silicide film disposed over the source/drain regions;
   (b) after the step (a), setting the semiconductor wafer over a first lower electrode in a first gas phase treatment chamber with the first main surface facing upward;
   (c) after the step (b), while the semiconductor wafer being set over the first lower electrode grounded with the first main surface facing upward, carrying out a plasma treatment on the first main surface under a first gas atmosphere which contains an inert gas as one of main components and which substantially does not contain hydrogen; and
   (d) after the step (c), while the semiconductor wafer being set over the first lower electrode with the first main surface facing upward, forming a silicon nitride film over the first main surface by a CVD treatment;
   (e) forming a silicon oxide film type premetal interlayer insulation film over the silicon nitride film;
   (f) opening a contact hole in the premetal interlayer insulation film with the silicon nitride film as an etching stop film;
   (g) after the step (f), etching the silicon nitride film, thereby to extend the contact hole to the top surface of the silicide film disposed over the source/drain regions;
   (h) after the step (g), setting the semiconductor wafer over a second lower electrode in a second gas phase treatment chamber with the first main surface facing upward;
   (i) after the step (h), while the semiconductor wafer being set over the second lower electrode grounded with the first main surface facing upward, carrying out a plasma treatment on the first main surface under a second gas atmosphere containing an inert gas as one of main components;
   (j) after the step (i), while the semiconductor wafer being set over the second lower electrode grounded with the first main surface facing upward, forming a barrier metal film over the inner surface of the contact hole; and
   (k) after the step (j), filling the contact hole with a metal containing tungsten as a main component.

2. The method for manufacturing a semiconductor integrated circuit device according to claim 1, wherein the inert gas is an argon gas.

3. The method for manufacturing a semiconductor integrated circuit device according to claim 2, wherein the first gas atmosphere substantially does not contain a hydrogen gas and an ammonia gas.

4. The method for manufacturing a semiconductor integrated circuit device according to claim 1, wherein the first gas atmosphere contains a nitrogen gas as one of main components.

5. The method for manufacturing a semiconductor integrated circuit device according to claim 1,
   wherein the MISFET further has:
      (x5) a sidewall insulation film disposed at the sidewall of the gate electrode; and
      (x6) an extension region which is a semiconductor region disposed in a region under the sidewall insulation film, and
   wherein the lower end width of the sidewall insulation film is smaller than the depth of the extension region.

6. The method for manufacturing a semiconductor integrated circuit device according to claim 1, wherein the inert gas of the step (i) is an argon gas.

7. The method for manufacturing a semiconductor integrated circuit device according to claim 1, wherein the second gas atmosphere substantially does not contain hydrogen.

8. The method for manufacturing a semiconductor integrated circuit device according to claim 1, wherein the second gas atmosphere substantially does not contain a hydrogen gas and an ammonia gas.

9. The method for manufacturing a semiconductor integrated circuit device according to claim 1, wherein the second gas atmosphere substantially does not contain a nitrogen gas.

10. A method for manufacturing a semiconductor integrated circuit device, comprising the steps of:
    (a) forming a MISFET in a region in the vicinity of a first main surface of a semiconductor wafer,
    the MISFET having:
       (x1) source/drain regions disposed in a surface region of the first main surface;
       (x2) a gate insulation film disposed over the first main surface;
       (x3) a gate electrode disposed over the gate insulation film; and
       (x4) a silicide film disposed over the source/drain regions;
    (b) after the step (a), disposing the semiconductor wafer over a first lower electrode in a first gas phase treatment chamber with the first main surface facing upward;
    (c) after the step (b), while the semiconductor wafer being set over the first lower electrode with the first main surface facing upward, carrying out a low bias plasma treatment with a self bias of the first lower electrode of 10 V or less on the first main surface under a first gas atmosphere which contains an inert gas as one of main components and which substantially does not contain hydrogen; and
    (d) after the step (c), while the semiconductor wafer being set over the first lower electrode with the first main surface facing upward, forming a silicon nitride film over the first main surface by a CVD treatment.

11. The method for manufacturing a semiconductor integrated circuit device according to claim 10, wherein the inert gas is an argon gas.

12. The method for manufacturing a semiconductor integrated circuit device according to claim 10, wherein the first gas atmosphere substantially does not contain a hydrogen gas and an ammonia gas.

13. The method for manufacturing a semiconductor integrated circuit device according to claim 10, wherein the first gas atmosphere substantially contains a nitrogen gas as one of main components.

14. The method for manufacturing a semiconductor integrated circuit device according to claim 10,
wherein the MISFET further has:
(x5) a sidewall insulation film disposed at the sidewall of the gate electrode; and
(x6) an extension region which is a semiconductor region disposed in a region under the sidewall insulation film, and
wherein the lower end width of the sidewall insulation film is smaller than the depth of the extension region.

15. A method for manufacturing a semiconductor integrated circuit device, comprising the steps of:
(a) forming a MISFET in a region in the vicinity of a first main surface of a semiconductor wafer,
the MISFET having:
(x1) source/drain regions disposed in a surface region of the first main surface;
(x2) a gate insulation film disposed over the first main surface;
(x3) a gate electrode disposed over the gate insulation film; and
(x4) a silicide film disposed over the source/drain regions;
(b) forming a silicon oxide film type premetal interlayer insulation film over the silicon nitride film;
(c) opening a contact hole in the premetal interlayer insulation film with the silicon nitride film as an etching stop film;
(d) after the step (c), etching the silicon nitride film, thereby to extend the contact hole to the top surface of the silicide film disposed over the source/drain regions;
(e) after the step (d), setting the semiconductor wafer over a lower electrode in a gas phase treatment chamber with the first main surface facing upward;
(f) after the step (e), while the semiconductor wafer being set over the lower electrode grounded with the first main surface facing upward, carrying out a plasma treatment on the first main surface under a gas atmosphere which contains an inert gas as one of main components and which substantially does not contain hydrogen;
(g) after the step (f), while the semiconductor wafer being set over the first lower electrode with the first main surface facing upward, forming a barrier metal film over the inner surface of the contact hole; and
(h) after the step (g), filling the contact hole with a metal containing tungsten as a main component.

16. The method for manufacturing a semiconductor integrated circuit device according to claim 15, wherein the inert gas is an argon gas.

17. The method for manufacturing a semiconductor integrated circuit device according to claim 15, wherein the gas atmosphere substantially does not contain a nitrogen gas.

* * * * *